US012566512B2

(12) United States Patent
Tong et al.

(10) Patent No.: US 12,566,512 B2
(45) Date of Patent: Mar. 3, 2026

(54) TOUCH DISPLAY PANEL AND ELECTRONIC DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Kemeng Tong, Beijing (CN); Fan He, Beijing (CN); Cong Fan, Beijing (CN); Junxi Wang, Beijing (CN); Chi Yu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/820,447

(22) Filed: Aug. 30, 2024

(65) Prior Publication Data

US 2024/0419275 A1 Dec. 19, 2024

Related U.S. Application Data

(63) Continuation of application No. 18/350,951, filed on Jul. 12, 2023, now Pat. No. 12,105,905, which is a (Continued)

(30) Foreign Application Priority Data

Jan. 20, 2020 (WO) ................ PCT/CN2020/073237

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0443* (2019.05); *G06F 3/0446* (2019.05); (Continued)

(58) Field of Classification Search
CPC ............ H10K 59/40; G06F 3/041–047; G06F 2203/041–04114
See application file for complete search history.

(56) References Cited

U.S. PATENT DOCUMENTS

| | | | | |
|---|---|---|---|---|
| 9,041,869 B2 * | 5/2015 | Kim | G06F 3/0412 345/173 |
| 11,016,619 B2 * | 5/2021 | Xie | G06F 3/0443 |

(Continued)

FOREIGN PATENT DOCUMENTS

| | | | | |
|---|---|---|---|---|
| CN | 108054193 A * | 5/2018 | G06F 3/0412 |
| CN | 109410758 A | 3/2019 | |

(Continued)

OTHER PUBLICATIONS

Chinese First Office Action in Application No. 2023103740469; Mailing Date: Dec. 27, 2025.

*Primary Examiner* — Sanjiv D. Patel
(74) *Attorney, Agent, or Firm* — Dilworth & Barrese, LLP.; Michael J. Musella, Esq.

(57) ABSTRACT

A touch display panel, includes: a base substrate, and a display structure and a touch structure that are stacked on the base substrate, the touch structure includes a first metal mesh layer, an orthographic projection of a mesh hole of at least one first metal mesh of the first metal mesh layer on the base substrate covers orthographic projections of two pixel opening regions of two adjacent sub-pixels on the base substrate, and the two adjacent sub-pixels are configured to emit light of a first primary color; and a center distance between two pixel opening regions is smaller than a center distance between two pixel opening regions of two sub-pixels emit-
(Continued)

ting light of same one other primary color, which is different to the first primary color. The touch display panel has a good display effect.

20 Claims, 12 Drawing Sheets

Related U.S. Application Data continuation of application No. 17/295,685, filed as application No. PCT/CN2020/082736 on Apr. 1, 2020, now Pat. No. 11,782,543.

(51) Int. Cl.

| | |
|---|---|
| ***H10K 59/122*** | (2023.01) |
| ***H10K 59/131*** | (2023.01) |
| ***H10K 59/40*** | (2023.01) |
| ***H10K 59/80*** | (2023.01) |
| *H10K 59/35* | (2023.01) |

(52) U.S. Cl.

CPC ......... *G06F 3/0448* (2019.05); *H10K 59/122* (2023.02); *H10K 59/131* (2023.02); *H10K 59/40* (2023.02); *H10K 59/80515* (2023.02); *G06F 2203/04111* (2013.01); *G06F 2203/04112* (2013.01); *H10K 59/351* (2023.02); *H10K 59/873* (2023.02)

(56) References Cited

U.S. PATENT DOCUMENTS

| | | | | |
|---|---|---|---|---|
| 2014/0160372 | A1* | 6/2014 | Li | G06F 3/0446 349/12 |
| 2016/0349873 | A1* | 12/2016 | Zhang | G06F 3/0443 |
| 2018/0032188 | A1* | 2/2018 | Park | G06F 3/0446 |
| 2019/0140030 | A1* | 5/2019 | Huangfu | G09G 3/3233 |

FOREIGN PATENT DOCUMENTS

| | | |
|---|---|---|
| CN | 110061014 A | 7/2019 |
| CN | 110658952 A | 1/2020 |

* cited by examiner

TOUCH DISPLAY PANEL AND ELECTRONIC DEVICE

CROSS-REFERENCE TO RELATED APPLICATION

This patent application is a continuation of U.S. Ser. No. 18/350,951 filed on Jul. 12, 2023 which is a continuation of U.S. Ser. No. 17/295,685 filed on May 20, 2021 which is a national stage application of international application PCT/CN2020/082736 filed on Apr. 1, 2020 and claims the priority of the PCT International Application No. PCT/CN/2020/073237, filed on Jan. 20, 2020, the entire contents of all these applications are hereby incorporated by reference herein in its entirety.

TECHNICAL FIELD

The embodiments of the present disclosure relate to a touch display panel and an electronic device.

BACKGROUND

A user interface with a touch function is widely used in various electronic devices, such as display devices. A touch structure used to implement the touch function includes a touch electrode structure, and the setting of the touch electrode structure is an important factor that affects user experience.

SUMMARY

At least one embodiment of the present disclosure discloses a touch display panel, which comprises: a base substrate, and a display structure and a touch structure that are stacked on the base substrate; the display structure comprises a plurality of sub-pixels, the plurality of sub-pixels are arranged along a first direction and a second direction, and each of the plurality of sub-pixels comprises a light-emitting element and a pixel opening region exposing the light-emitting element; the first direction and the second direction intersect; the touch structure comprises a first metal mesh layer, the first metal mesh layer comprises a plurality of first metal meshes defined by a plurality of first metal lines, and orthographic projections of the plurality of first metal lines on the base substrate are located outside orthographic projections of a plurality of pixel opening regions of the plurality of sub-pixels on the base substrate; an orthographic projection of a mesh hole of each of at least one first metal mesh on the base substrate covers orthographic projections of two pixel opening regions of two adjacent sub-pixels on the base substrate, and the two adjacent sub-pixels are two first sub-pixels, and are configured to emit light of a first primary color; and a center distance between the two pixel opening regions of the two first sub-pixels is smaller than a center distance between two pixel opening regions of two sub-pixels emitting light of same one other primary color, which is different to the first primary color.

In some examples, areas of the two pixel opening regions of the two first sub-pixels are equal and smaller than an area of a pixel opening region of a sub-pixel that emits light of other primary color.

In some examples, the plurality of sub-pixels are in a plurality of pixel units, and each of the plurality of pixel units is configured to emit light of full-color; and the two first sub-pixels belong to two pixel units, respectively.

In some examples, each sub-pixel emitting light with a color different from the first primary color is configured to be shared by at least two pixel units, respectively.

In some examples, the first primary color is green.

In some examples, each of orthographic projections of mesh holes of other first metal meshes, which are directly connected to the at least one first metal mesh, on the base substrate, covers only an orthographic projection of a pixel opening region of one sub-pixel on the base substrate.

In some examples, the plurality of first metal meshes are arranged along the first direction and the second direction; and each of the plurality of first metal meshes is hexagonal, and extension directions of longest sides of respective first metal meshes are parallel to each other and are all along the second direction.

In some examples, a pixel opening region contour of a pixel opening region corresponding to each first metal mesh is hexagonal, and six sides of each first metal mesh are respectively parallel to six sides of the pixel opening region contour corresponding to each first metal mesh; two sides, which are close to each other, of two adjacent pixel opening region contours are parallel to each other, and a first metal line is between the two sides; and orthographic projections of the two sides, which are close to each other, of the two adjacent pixel opening region contours on the base substrate are both parallel to an orthographic projection of the first metal line on the base substrate, and a distance between one of the orthographic projections of the two sides and the orthographic projection of the first metal line on the base substrate and a distance between other of the orthographic projections of the two sides and the orthographic projection of the first metal line on the base substrate are identical.

In some examples, an average line width of the first metal line and a distance between the two adjacent pixel opening region contours satisfies a following relationship:

$$(\text{PDLGAPmax} - \text{PDLGAPmin}) * 0.5 < X < \text{PDLGAPmax} * 0.167,$$

where X is the average line width of the first metal line, and PDLGAPmax and PDLGAPmin are a maximum value and a minimum value of the distance between the two adjacent pixel opening region contours, respectively.

In some examples, the plurality of sub-pixels further comprise a second sub-pixel and a third sub-pixel, the second sub-pixel is configured to emit light of a second primary color, and the third sub-pixel is configured to emit light of a third primary color, an area of a pixel opening region of the first sub-pixel, an area of a pixel opening region of the second sub-pixel, and an area of a pixel opening region of the third sub-pixel sequentially increase; a contour of pixel opening regions of the two first sub-pixels, which are adjacent, is a first pixel opening region contour, a pixel opening region contour of the second sub-pixel is a second pixel opening region contour, and a pixel opening region contour of the third sub-pixel is a third pixel opening region contour; and a maximum value of a distance between two adjacent pixel opening region contours is a distance between a second pixel opening region contour and a third pixel opening region contour, which are adjacent in a third direction, and the third direction is neither parallel nor perpendicular to the second direction.

In some examples, a first metal mesh corresponding to the second pixel opening region contour comprises a first side and a second side, which are adjacent, the first side is neither parallel nor orthogonal to the second direction, and the second side is neither parallel nor orthogonal to the second direction; the first side is between the second pixel opening region contour and the first pixel opening region contour, and the second side is located between the second pixel opening region contour and the third pixel opening region contour; and the first side is longer than the second side.

In some examples, the first metal mesh layer comprises a plurality of first touch sub-electrodes and a plurality of first connection electrodes arranged along the first direction, the plurality of first touch sub-electrodes and the plurality of first connection electrodes are alternately distributed one by one and electrically connected in sequence to form a first touch electrode extending along the first direction; the first metal mesh layer further comprises a plurality of second touch sub-electrodes arranged sequentially along the second direction and spaced apart from each other; and each of the plurality of first touch sub-electrodes and each of the second touch sub-electrodes are spaced apart from each other, and each of the plurality of first touch sub-electrodes and each of the second touch sub-electrodes comprise a plurality of first metal meshes, respectively.

In some examples, the touch structure further comprises a second metal mesh layer, and the first metal mesh layer and the second metal mesh layer are separated by an insulation layer between the first metal mesh layer and the second metal mesh layer; the second metal mesh layer comprises a plurality of second metal meshes defined by a plurality of second metal lines, and orthographic projections of the plurality of second metal lines on the base substrate are located outside the orthographic projections of the plurality of pixel opening regions of the plurality of sub-pixels on the base substrate; the second metal mesh layer comprises a plurality of second connection electrodes spaced apart from each other, and each of the plurality of second connection electrodes is electrically connected to adjacent second touch sub-electrodes through a plurality of holes in the insulation layer, thereby electrically connecting the adjacent second touch sub-electrodes to form a second touch electrode extending in the second direction.

In some examples, a plurality of second metal lines of at least two second metal meshes in each of the plurality of second connection electrodes respectively overlap with a plurality of first metal lines of at least two first metal meshes in an adjacent second touch sub-electrode in a direction perpendicular to the base substrate, so that the at least two first metal meshes have a plurality of vertices overlapping with the at least two second metal meshes, each of the plurality of holes is at a vertex, and the vertex is called a connection vertex.

In some examples, at most one vertex among vertices adjacent to each connection vertex is a connection vertex.

In some examples, vertices adjacent to each connection vertex are not connection vertices.

In some examples, the at least two second metal meshes are edge metal meshes of the second connection electrode, and the at least two first metal meshes are edge metal meshes of the second touch electrode.

In some examples, adjacent second touch sub-electrodes are electrically connected through two second connection electrodes, and the two second connection electrodes are spaced apart from each other and are symmetrical with respect to a central axis extending in the second direction.

In some examples, an orthographic projection of each of the plurality of first connection electrodes on the second metal mesh layer is in a gap between the two second connection electrodes between adjacent second touch sub-electrodes; and each of the plurality of first touch sub-electrodes is electrically connected to an adjacent first connection electrode through at least one connection line comprising a plurality of first metal lines that are sequentially connected end to end.

In some examples, the plurality of first metal lines that are sequentially connected end to end respectively overlap with a plurality of second metal lines in the second connection electrode in a direction perpendicular to the base substrate.

In some examples, an average line width of the first metal line is greater than an average line width of the second metal line.

In some examples, a plurality of first metal lines in a boundary region between a first touch sub-electrode and a second touch sub-electrode, which are adjacent, respectively comprise a plurality of spaces, each space of the plurality of spaces divides a first metal line, where the each space is located, into two first metal line segments, one of the two first metal line segments belongs to the first touch sub-electrode, the other one of the two first metal line segments belongs to the second touch sub-electrode, so that the first touch sub-electrode and the second touch sub-electrode, which are adjacent, are insulated.

In some examples, the plurality of spaces comprises a plurality of first spaces on a straight line, and the plurality of first spaces are respectively on a plurality of first metal lines orthogonal to the straight line; and at least one first metal line is between at least two first spaces, and the at least one first metal line intersects the straight line, and there is no space at an intersection of the at least one first metal line and the straight line.

In some examples, the first metal mesh layer comprises a plurality of first touch electrodes along the second direction; at least one first metal mesh comprises three first metal mesh parts insulated from each other, and the three first metal mesh parts respectively belong to three touch sub-electrodes that are insulated from each other, the three touch sub-electrodes comprise two first touch sub-electrodes that are adjacent in the second direction and a second touch sub-electrode between the two first touch sub-electrodes, or comprise two second touch sub-electrodes that are adjacent in the first direction and a first touch sub-electrode between the two second touch sub-electrodes.

At least one embodiment of the present disclosure further provides an electronic device, which comprises the touch display panel provided by any of the above embodiments.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

Figure 1A:
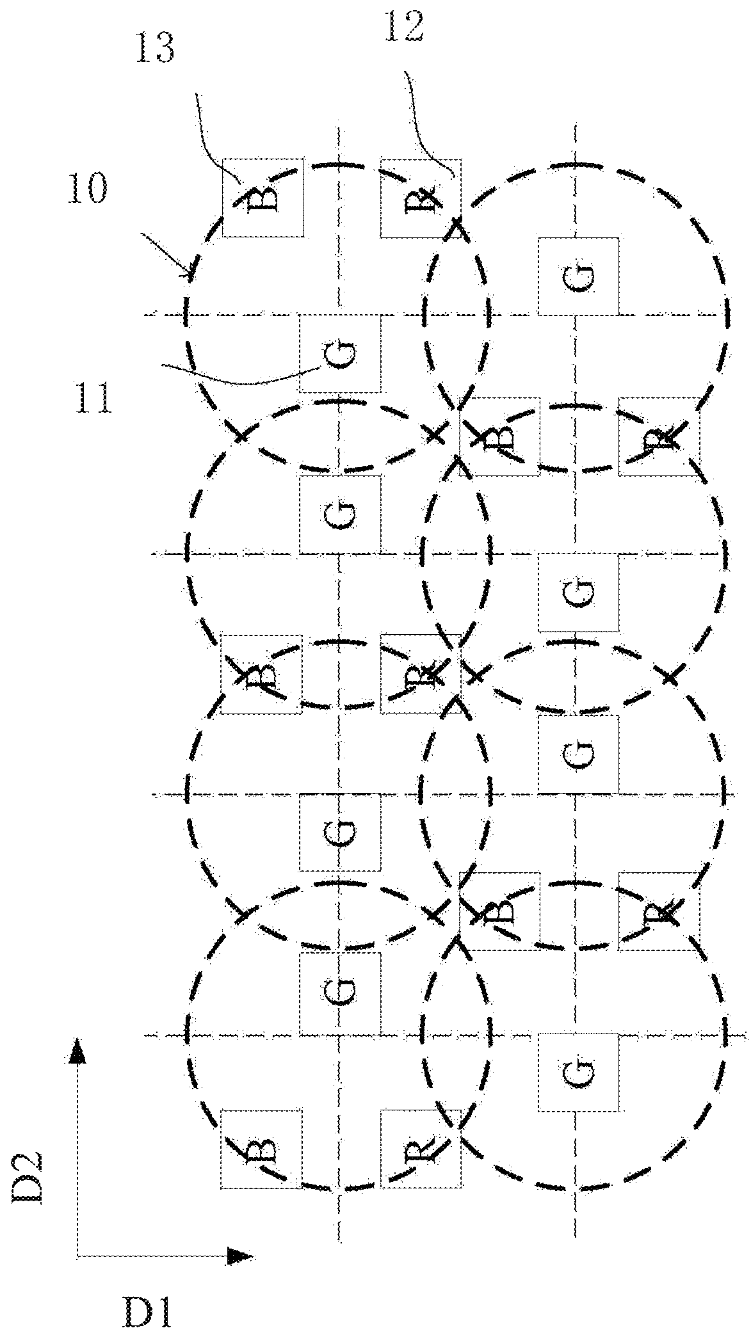
FIG. 1A is a schematic diagram of a pixel arrangement of a display structure provided by at least one embodiment of the present disclosure.

The following will clearly and completely describe the technical solutions in the embodiments of this disclosure with reference to the non-limiting example embodiments shown in the drawings and detailed in the following description, and more fully explain the example embodiments of the present disclosure and their various features and advantageous details. It should be noted that the features shown in the figures are not necessarily drawn to scale. The present disclosure omits descriptions of known materials, components, and process techniques so as not to obscure example embodiments of the present disclosure. The examples given are only intended to facilitate understanding of the implementation of the exemplary embodiments of the present disclosure and further enable those skilled in the art to implement the exemplary embodiments. Therefore, these examples should not be understood as limiting the scope of the embodiments of the present disclosure.

Unless otherwise defined, all the technical and scientific terms used herein have the same meanings as commonly understood by one of ordinary skill in the art to which the present disclosure belongs. The terms “first,” “second,” etc., which are used in the present disclosure, are not intended to indicate any sequence, amount or importance, but distinguish various components. Furthermore, in various embodiments of the present disclosure, the same or similar reference numerals refer to the same or similar components.

Organic light-emitting diode (OLED) display panels have the characteristics of self-luminescence, high contrast, low energy consumption, wide viewing angle, fast response speed, capable of being applied to flexible panels, wide operating temperature range, simple manufacturing, etc., and have a broad development prospect. In order to meet the diverse needs of users, it is of great significance to integrate a plurality of functions in the display panel, such as a touch function, a fingerprint recognition function, and the like. For example, forming an on-cell touch structure in an OLED display panel is an implementation method, and the method achieves the touch function of the display panel by forming the touch structure on an encapsulation film of the OLED display panel.

For example, a mutual-capacitive touch structure includes a plurality of touch electrodes, and the plurality of touch electrodes include touch driving electrodes and touch sensing electrodes extending in different directions, and the touch driving electrodes and the touch sensing electrodes form mutual capacitors for touch sensing at portions where the touch driving electrodes and the touch sensing electrodes cross each other. The touch driving electrodes are used to input excitation signals (touch driving signals), and the touch sensing electrodes are used to output touch sensing signals. By inputting the excitation signal to, for example, the touch driving electrode longitudinally extending, and receiving the touch sensing signal from, for example, the touch sensing electrode laterally extending, a detection signal reflecting a capacitance value of a coupling point (for example, the cross point) of the horizontal electrode and the vertical electrode can be obtained. In the case where the finger touches the capacitive screen, the finger affects the coupling between the touch driving electrode and the touch sensing electrode near the touch point, thereby changing the capacitance of the mutual capacitor at the intersection point between the two electrodes, resulting in a change in the touch sensing signal. According to the data of the two-dimensional capacitance change of the touch screen based on the touch sensing signal, the coordinates of the touch point can be calculated.

A touch electrode is formed by a metal mesh pattern. The metal mesh has good ductility and flexibility, can improve the bending resistance and workability of the touch electrode, and is suitable for flexible electronic applications.

For example, in the case where the touch electrode formed by the metal mesh is integrated into the display panel, the metal lines in the metal mesh need to be arranged outside the pixel opening regions of the display panel to prevent the metal lines from blocking the light and avoid causing the pixel aperture ratio to decrease. For example, the metal lines in the metal mesh are arranged corresponding to the pixel spacing regions among the pixel opening regions, and mesh holes in the metal mesh are arranged in one-to-one correspondence with the pixel opening regions to expose the light-emitting elements of respective sub-pixels.

The inventor found that, for example, interval distances of respective sub-pixels in a display panel are not uniform. In the case where an interval distance between two sub-pixels is close, the metal line correspondingly provided between the two sub-pixels will be closer to the pixel opening regions of the sub-pixels, which is likely to adversely affect the display function of the two sub-pixels, for example, under oblique viewing, the metal line blocks the light emitted by the sub-pixels, reflects the light emitted by the sub-pixels to cause problems, such as cross-color. In addition, if the area of the pixel opening region of the sub-pixel is small, the adverse effect will be more obvious.

At least one embodiment of the present disclosure provides a touch display panel, including a base substrate, and a display structure and a touch structure that are stacked on the base substrate, an orthographic projection of a mesh hole of each of at least one first metal mesh on the base substrate covers orthographic projections of two pixel opening regions of two adjacent sub-pixels on the base substrate, and the two adjacent sub-pixels are two first sub-pixels, and are configured to emit light of a first primary color; a center distance between the two pixel opening regions of the two first sub-pixels is smaller than a center distance between two pixel opening regions of two sub-pixels emitting light of the same one other primary color, which is different to the first primary color.

It should be noted that the aforementioned "center" refers to the geometric center of the planar shape, which is parallel to the base substrate, of the pixel opening region.

The pixel opening regions of two sub-pixels with a relatively small interval distance are arranged to share one mesh hole, that is, the metal line between the two pixel opening regions is removed, so that the metal lines in the metal mesh have a sufficient distance away from the pixel opening region, thereby avoiding adverse effects on the display caused by the metal line being relatively close to the pixel opening region, and effectively improving the display effect.

Because the two adjacent sub-pixels emit light of the same color, the pixel opening regions of the two adjacent sub-pixels can be closer without causing the problem of cross-color; in addition, for example, in the case where the organic light-emitting diode is prepared by a precision metal mask (FMM) evaporation process, one evaporation hole can be used to form the light-emitting layers of the two sub-pixels, thereby reducing the difficulty of the manufacturing process. For example, the light-emitting layers of the two sub-pixels are connected to each other to be as an integral structure.

For example, the areas of the pixel opening regions of the two sub-pixels are equal and smaller than the area of the pixel opening region of the sub-pixel emitting light of other primary color, which is different to the first primary color.

In order to improve the display resolution, the conventional mode, in which the red sub-pixel, the green sub-pixel, and the blue sub-pixel are used to simply define a pixel, can changed, it can use a relatively small number of sub-pixels to simulate the performance capability of the same pixel resolution, thereby reducing the difficulty of the manufacturing process and the manufacturing cost. For example, in some pixel arrangements, the pixel structure includes a plurality of first sub-pixels, a plurality of second sub-pixels, and a plurality of third sub-pixels. The first sub-pixels are configured to emit light of a first primary color, and the second sub-pixels are configured to emit light of a second primary color, and the third sub-pixels are configured to emit light of a third primary color. Each pixel unit includes a first sub-pixel; each sub-pixel emitting light of a color different from the first primary color, that is, each second sub-pixel and each third sub-pixel are respectively shared by at least two pixel units; each pixel unit is configured to emit light of full-color. Because each pixel unit includes a first sub-pixel, the density of the first sub-pixels is the highest.

Because the second sub-pixel and the third sub-pixel in each pixel unit are shared by adjacent pixel units, the pixel unit in the embodiments of the present disclosure is not a pixel unit in a strict sense, that is, a pixel is defined by a first sub-pixel, a second sub-pixel, and a third sub-pixel. Therefore, the pixel unit can be referred to as a virtual pixel unit.

For example, the plurality of pixel units are arranged in an array according to a first direction and a second direction, the first direction and the second direction are different directions, for example, the first direction and the second direction are orthogonal to each other. For example, in the first direction of the pixel array and in the second direction of the pixel array, the density of the sub-pixels is 1.5 times the density of the pixel units.

For example, using the difference in the resolution of sub-pixels of different colors by the human eye, different pixels can share some color sub-pixels, position resolutions of which are not sensitive. For example, the first primary color is green, the second primary color is red, and the third primary color is blue.

For example, according to the physiological structure of the human eye, the resolution of the human eye is determined by the density of rod-shaped photoreceptor cells that are sensitive to brightness and cone-shaped photoreceptor cells that are sensitive to color in the retina of the human eye. Among the three primary colors, the density of the cone-shaped cells that are sensitive to short-wavelength blue is the lowest, the density of the cone-shaped cells that are sensitive to red is second. In addition, the brightness effect of blue and red (stimulus to the rod-shaped cells that are sensitive to brightness) is much lower than the brightness effect of green, which results in the sensitivity of the human eye to the blue sub-pixel and the red sub-pixel is significantly lower than the sensitivity of the green sub-pixel. At a certain pixel resolution, although the human eye can distinguish the brightness center position of the pixel and have a normal sense of color, however, the human eye cannot distinguish the position or boundary of the blue or red sub-pixel on the pixel scale, so that it is possible to share adjacent blue and red sub-pixels between adjacent pixels to a certain extent.

For example, the sub-pixels in the present disclosure are pixel structures corresponding to light-emitting elements in a one-to-one correspondence manner, and have independent pixel driving circuits.

For example, the touch display panel may be a liquid crystal display panel, an organic light-emitting diode display panel, a quantum dot light-emitting diode display panel, or an electronic paper display panel, etc., and the embodiments of the present disclosure are not limited to the type of the display panel.

Hereinafter, the touch display panel provided by the embodiments of the present disclosure will be exemplarily described by taking the first primary color as green and the touch display panel being an organic light-emitting diode display panel as an example, but the embodiments of the present disclosure are not limited thereto.

Figure 1B:
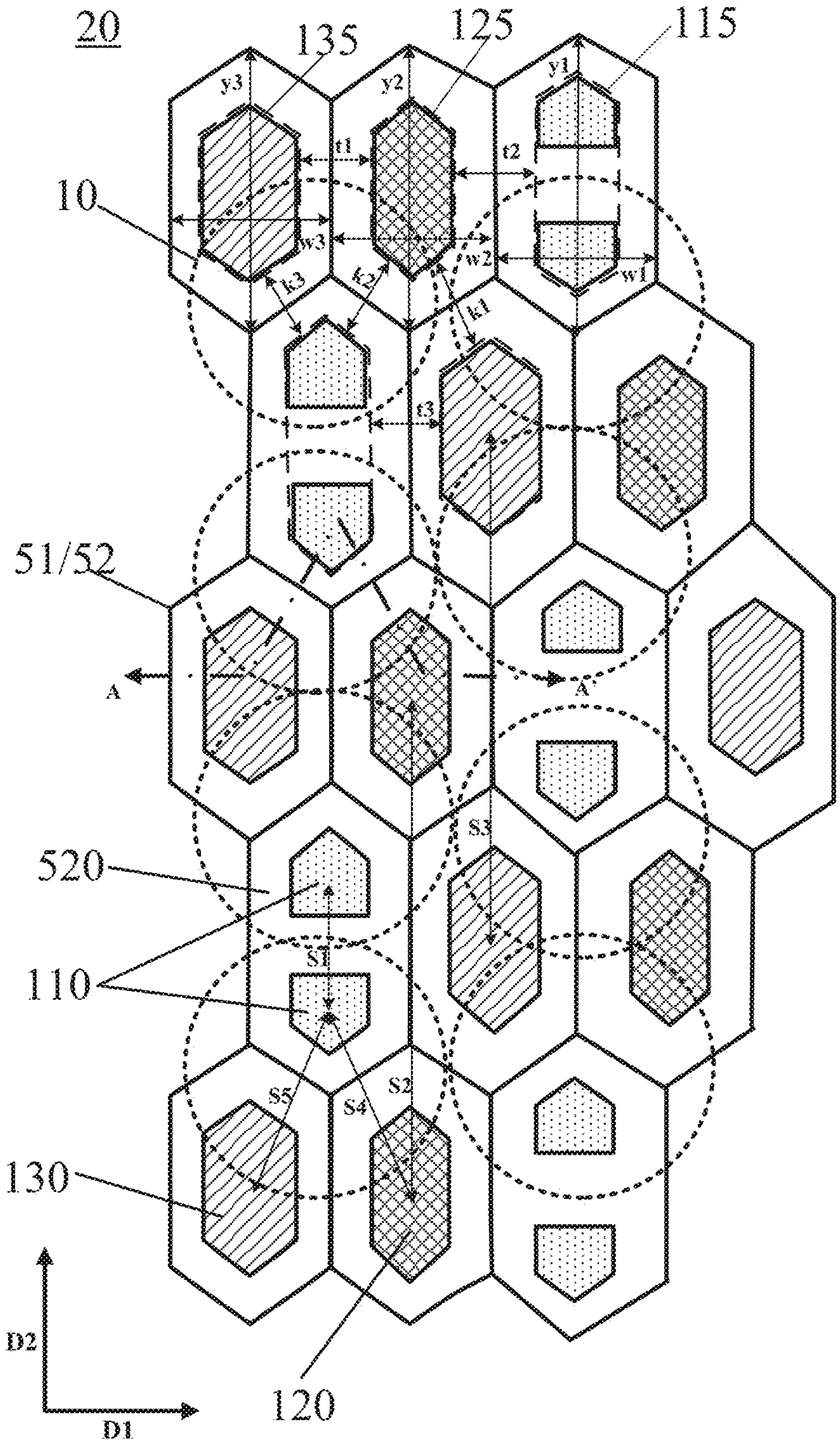
FIG. 1B is a schematic diagram of a display structure provided by at least one embodiment of the present disclosure.

FIG. 1A shows a schematic diagram of a pixel arrangement provided by at least one embodiment of the present disclosure. As shown in FIG. 1A, the pixel arrangement structure includes a plurality of sub-pixels, and the plurality of sub-pixels are arranged in a first direction D1 and a second direction D2. The first direction D1 and the second direction D2 are different directions, for example, are orthogonal to each other. The plurality of sub-pixels comprise a plurality of first sub-pixels, a plurality of second sub-pixels, and a plurality of third sub-pixels. For example, the first sub-pixel is a green (G) sub-pixel 11, the second sub-pixel is a red (R) sub-pixel 12, and the third sub-pixel is a blue (B) sub-pixel 13; each pixel unit 10 includes a green sub-pixel 11, and each red sub-pixel 12 and each blue sub-pixel 13 are respectively shared by two adjacent pixel units 10, so that the boundary of the pixel unit 10 is also very blurred. The embodiments of the present disclosure are not limited to the shape of the pixel unit 10. In FIGS. 1A and 1B, the pixel unit 10 is exemplarily indicated by a dotted circle. The plurality of pixel units 10 are arranged in an array along the first direction D1 and the second direction D2.

For example, as shown in FIG. 1A, the plurality of green sub-pixels 11 are arranged in pairs, two green sub-pixels 11 in each pair are adjacent to each other, and an interval distance between adjacent green sub-pixels is smaller than an interval distance between two sub-pixels emitting light of the same one other color, that is, is smaller than an interval distance between the red sub-pixel 12 and the blue sub-pixel 13, is also smaller than an interval distance between the green sub-pixel 11 and the red sub-pixel 12, and is smaller than an interval distance between the green sub-pixel 11 and the blue sub-pixel 13. For example, green sub-pixels in a pair 11 are arranged along the second direction D2.

For example, a red sub-pixel 12 and a blue sub-pixel 13 are arranged between two green sub-pixel pairs adjacent in the second direction D2, and the red sub-pixel 12 and the blue sub-pixel 13 are arranged along the first direction D1.

Figure 1C:
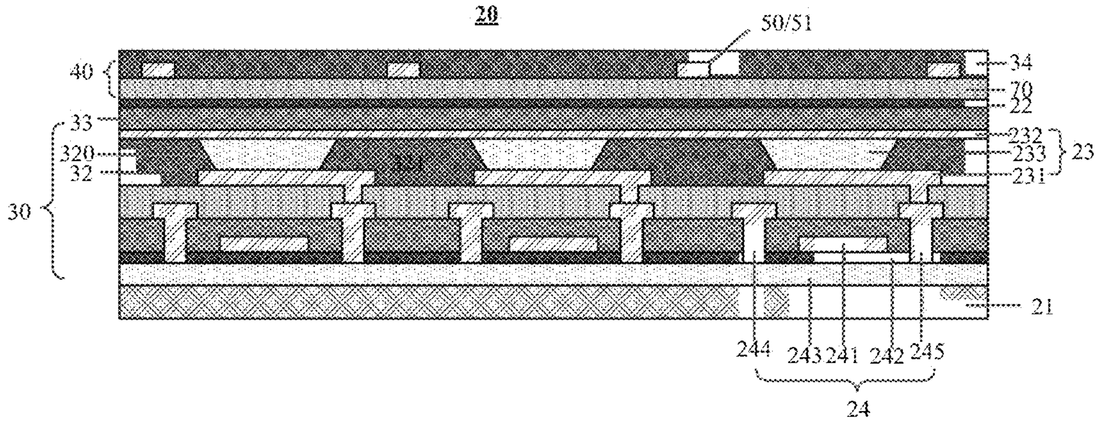
FIG. 1C is a cross-sectional view of FIG. 1B along a section line A-A'.

FIG. 1B shows a touch display panel provided by at least one embodiment of the present disclosure, a display structure in the touch display panel adopts the pixel arrangement structure shown in FIG. 1A; and FIG. 1C is a cross-sectional view of FIG. 1B along a section line A-A'.

Referring to FIG. 1B and FIG. 1C, the touch display panel 20 includes a base substrate 21 and a display structure 30 and a touch structure 40 that are stacked on the base substrate 21. The touch structure 40 is located on the display structure 30, and is closer to an user side in an used process.

For example, the touch display panel is an OLED display panel, and the display structure 30 includes a plurality of sub-pixels, and the plurality of sub-pixels includes the green sub-pixel 11, the red sub-pixel 12, and the blue sub-pixel 13 described above. Each sub-pixel includes a light-emitting element 23 and a pixel driving circuit that drives the light-emitting element 23 to emit light. The embodiments of the present disclosure are not limited to the type and specific composition of the pixel driving circuit. For example, the pixel driving circuit may be a current driving type or a voltage driving type, and may be a 2T1C (that is, two transistors and one capacitor, the two transistors includes a driving transistor and a data writing transistor) driving circuit, may be a driving circuit that further includes a compensation circuit (compensation transistor), a light-emitting control circuit (light-emitting control transistor), a reset circuit (reset transistor), etc., based on 2T1C.

For the sake of clarity, FIG. 1C only shows the first transistor 24 directly electrically connected to the light-emitting element 23 in the pixel driving circuit. The first transistor 24 may be a driving transistor and is configured to work in a saturated state and control the magnitude of a current that drives the light-emitting element 23 to emit light. For example, the first transistor 24 may also be a light-emitting control transistor, which is used to control whether a current for driving the light-emitting element 23 to emit light flows or not. The embodiments of the present disclosure are not limited to the specific type of the first transistor.

For example, the light-emitting element 23 is an organic light-emitting diode, and includes a first electrode 231, a light-emitting layer 233, and a second electrode 232. One of the first electrode 231 and the second electrode 232 is an anode, and the other of the first electrode 231 and the second electrode 232 is a cathode; for example, the first electrode 231 is an anode, and the second electrode 232 is a cathode. For example, the light-emitting layer 233 is an organic light-emitting layer or a quantum dot light-emitting layer. For example, in addition to the light-emitting layer 233, the light-emitting element 23 may also include auxiliary functional layers, such as a hole injection layer, a hole transport layer, an electron injection layer, and an electron transport layer. For example, the light-emitting element 23 has a top emission structure, the first electrode 231 has reflectivity and the second electrode 232 has transmissivity or semi-transmissivity. For example, the first electrode 231 is formed of a high work function material to serve as an anode, such as an ITO/Ag/ITO laminated structure; the second electrode 232 is formed of a low work function material to serve as a cathode, such as a semi-transmissive metal or metal alloy material, such as an Ag/Mg alloy material.

The first transistor 24 includes a gate electrode 241, a gate insulation layer 242, an active layer 243, a first electrode 244, and a second electrode 245, and the second electrode 245 is electrically connected to the first electrode 231 of the light-emitting element 23. The embodiments of the present disclosure are not limited to the type, material, and structure of the first transistor 24, for example, the first transistor 24 may be a top gate type, a bottom gate type, etc., the active layer 243 of the first transistor 24 may be amorphous silicon, polysilicon (low temperature polysilicon and high temperature polysilicon), oxide semiconductor (for example, indium gallium tin oxide (IGZO)), etc., and the first transistor 24 may be N-type or P-type.

The transistors used in the embodiments of the present disclosure may be thin film transistors, field effect transistors, or other switching devices with the like characteristics, and the embodiments of the present disclosure are described by taking thin film transistors as an example. A source electrode and a drain electrode of the transistor used herein may be symmetrical in structure, so the source electrode and the drain electrode of the transistor may have no difference in structure. In the embodiments of the present disclosure, in order to distinguish two electrodes of the transistor apart from a gate electrode, one of the two electrodes is directly referred to as a first electrode, and the other of the two electrodes is referred to as a second electrode.

Referring to FIG. 1B and FIG. 1C, the display structure 30 further includes a pixel defining layer 32, the pixel defining layer 32 is disposed on the first electrode 231 of the light-emitting element 23, a plurality of openings 320 are formed in the pixel defining layer 32 to respectively expose the first electrodes 231 of a plurality of sub-pixels, thereby defining the pixel opening region of each sub-pixel. The light-emitting layer of the sub-pixel is formed in the pixel opening region, and the second electrode 232 is formed as a common electrode (that is, shared by the plurality of sub-pixels); the pixel defining layer 32 includes a pixel opening region 110 of the green sub-pixel 11 (the first sub-pixel), a pixel opening region 120 of the red sub-pixel 12 (the second sub-pixel), and a pixel opening region 130 of the blue sub-pixel 13 (the third sub-pixel).

The touch structure 40 includes a first metal mesh layer 50. The first metal mesh layer 50 includes a plurality of first metal meshes 52 defined by a plurality of first metal lines 51, orthographic projections of the plurality of first metal lines

51 on the base substrate 21 are located outside orthographic projections of the pixel opening regions of the plurality of sub-pixels on the base substrate 21, that is, falls into the orthographic projections of the pixel separation regions among the pixel opening regions on the base substrate 21, and the pixel separation regions are also non-opening regions 321 of the pixel defining layer 32. The pixel separation regions are used to separate the pixel opening regions of the plurality of sub-pixels, separate the light-emitting layers of the respective sub-pixels, and prevent cross-color.

As shown in FIG. 1B, an orthographic projection of a mesh hole 520 of at least one first metal mesh 52 on the base substrate 21 covers orthographic projections of two pixel opening regions 100 of two adjacent green sub-pixels 11 (that is, a green sub-pixel pair) on the base substrate, that is, there is no first metal line 51 correspondingly provided between the two pixel opening regions 110.

As shown in FIG. 1B, the center distance S1 between the pixel opening regions 110 of the two adjacent green sub-pixels 11 is smaller than the center distance between the two pixel opening regions of the two sub-pixels emitting light of the same one other primary color. For example, the center distance S1 between the pixel opening regions 110 of the two adjacent green sub-pixels 11 is smaller than the center distance S2 between the pixel opening regions 120 of the two adjacent red sub-pixels 12, or the center distance S3 between the pixel opening regions 130 of the two adjacent blue sub-pixels 13.

For example, the center distance between the pixel opening regions 110 of the two adjacent green sub-pixels 11 is smaller than the center distance between the pixel opening region 110 of one green sub-pixel 11 and the pixel opening region of the sub-pixel of other color, which is adjacent to the one green sub-pixel 11. As shown in FIG. 1B, the center distance between the pixel opening regions 110 of the two adjacent green sub-pixels 11 is smaller than the center distance S4 between the pixel opening region 110 of the green sub-pixel 11 and the pixel opening region 120 of the red sub-pixel 12 that is adjacent to the green sub-pixel 11, and is also smaller than the center distance S5 between the pixel opening region 110 of the green sub-pixel 11 and the pixel opening region 130 of the blue sub-pixel 13 that is adjacent to the green sub-pixel 11.

For example, as shown in FIG. 1B, each of the orthographic projections of the mesh holes 520 of the other first metal meshes 52 directly connected to the first metal mesh 52 on the base substrate 21 only covers the orthographic projection of the pixel opening region of one sub-pixel on the base substrate. This is because the sub-pixels adjacent to the green sub-pixel pair are all sub-pixels of other colors, and the interval distance between the pixel opening region of the sub-pixel of other color and the pixel opening region of the sub-pixel that is adjacent to the sub-pixel of other color is relatively large, and the pixel opening regions are arranged in one-to-one correspondence with the first metal meshes 52, which can increase the density of touch electrodes, thereby increasing the sensitivity of touch.

For example, in the case where an organic light-emitting diode is prepared by a precision metal mask (FMM) evaporation process, one evaporation hole can be used to form the light-emitting layers of the two sub-pixels, thereby reducing the difficulty of the manufacturing process.

As shown in FIG. 1B, the plurality of first metal meshes 52 are arranged along the first direction D1 and the second direction D2. For example, a shape of each first metal mesh 52 is a polygon, for example, a hexagon; each first metal mesh 51 includes two sides that extend in the second direction D2 and are opposite to each other, and the lengths of the two sides may be the same or different, the two sides include the longest side of the first metal mesh 52, that is, the longest side of each first metal mesh is parallel to the second direction D2. For example, the six sides of the first metal mesh 52 include three pairs of sides, sides in each pair are opposite to each other, for example, sides, which are opposite to each other, in each pair of sides are parallel to each other; for another example, except for sides, which are parallel to the second direction D2, in a pair of sides, the sides, which are opposite to each other, of each of the other two pairs of sides are not parallel to each other.

As shown in FIG. 1B, for example, the shapes of the pixel opening regions of the green sub-pixel 11, the red sub-pixel 12, and the blue sub-pixel 13 are all polygons; for example, the shape of the pixel opening region of the red sub-pixel 12 and the shape of the pixel opening region of the blue sub-pixel 13 are both hexagons, and the shape of the pixel opening region of the green sub-pixel 11 is a pentagon.

A pixel opening region contour of a pixel opening region corresponding to each first metal mesh 52 (that is, the pixel opening region covered by the mesh hole of the first metal mesh) is shown by a dotted line in FIG. 1B. For example, the pixel opening regions 110 of two green sub-pixels 11 arranged in a pair are arranged side by side in the second direction, share a mesh hole 520 of a first metal mesh 52, the outer contours of the two pixel opening regions 110 are called the first pixel opening region contours 115, the pixel opening region contour of the red sub-pixel is the second pixel opening region contour 125, and the pixel opening region contour of the third sub-pixel is the third pixel opening region contour 135, the first pixel opening region contour 115, the second pixel opening region contour 125, and the third pixel opening region contour 135 are all hexagons and are adjacent to each other in pairs.

For example, the six sides of each first metal mesh are parallel to the six sides of the corresponding pixel opening region contour, respectively.

For example, two sides, which are close to each other, of two adjacent pixel opening region contours are parallel to each other, and a first metal line 51 is arranged between the two sides; the orthographic projections of the two sides, which are close to each other, of the two adjacent pixel opening region contours are both parallel to an orthographic projection of the first metal line 51 on the base substrate 51, a distance between one of the orthographic projections of the two sides and the orthographic projection of the first metal line 51 on the base substrate and a distance between the other of the orthographic projections of the two sides and the orthographic projection of the first metal line 51 on the base substrate are identical; that is, the first metal line 51 between the two adjacent pixel opening regions is located in the middle of the gap between the two pixel opening region contours, the minimum distance between the first metal line 51 and one of the two pixel opening regions (the distance between the first metal line 51 and the side, which is closest to the first metal line, of one of the two pixel opening regions) and the minimum distance between the first metal line 51 and the other of the two pixel opening regions are the same. This arrangement can avoid that the distance between the first metal line and any of the two pixel opening regions is too small to adversely affect the light of the pixel opening regions; in addition, this arrangement makes the first metal line have the same influence on the light of the two pixel opening regions, thereby improving the uniformity of the display.

For the convenience of description, a distance between orthographic projections of two sides, which are parallel to and close to each other, of two adjacent pixel opening region contours on the base substrate 21 is referred to as a gap between the two adjacent pixel opening region contours (PDL GAP).

For example, as shown in FIG. 1B, in the first direction D1, a gap t1 between a second pixel opening region contour 125 and a third pixel opening region contour 135 that are adjacent, a gap t2 between a second pixel opening region contour 125 and a first pixel opening region contour 115 that are adjacent, a gap t3 between orthographic projections of the first pixel opening region contour 115 and the third pixel opening region contour 135 that are adjacent on the base substrate are equal or approximately equal. For example, t1 is 23 micrometers, t2 is 22.8 micrometers, and t3 is 23 micrometers.

For example, as shown in FIG. 1B, in an oblique direction that is neither parallel nor perpendicular to the second direction D2, a gap k2 between the second pixel opening region contour 125 and the first pixel opening region contour 115 that are adjacent and a gap k3 between the third pixel opening region contour 135 and the first pixel opening region contour 115 that are adjacent are substantially equal, and are basically equal to t1, t2, and t3. For example, a gap k1 between the second pixel opening region contour 125 and the third pixel opening region contour 135 that are adjacent in the oblique direction that is neither parallel nor perpendicular to the second direction D2 is the maximum value (PDLGAPmax) of the gaps among the pixel opening region contours; that is, the gap k1 is greater than the gap between any other two adjacent pixel opening region contours (any one of t1, t2, t3, k2, and k3). For example, the gap t2 between the second pixel opening region contour 125 and the first pixel opening region contour 115 that are adjacent in the first direction D1 is the minimum value (PDLGAPmin) of the gaps among the pixel opening region contours; that is, the gap t2 is smaller than the gap between any other two adjacent pixel opening region contours (any one of t1, t3, k1, k2, and k3).

For example, an average line width of the first metal line 51, an average line width of the second metal line 61, and the gap between the two adjacent pixel opening region contours satisfy the following relationship:

$$(\text{PDLGAPmax} - \text{PDLGAPmin}) * 0.5 < X < \text{PDLGAPmax} * 0.167,$$

where X is the average line width of the first metal line 51 or the average line width of the second metal line 61, and PDLGAPmax and PDLGAPmin are the maximum value and the minimum value of the gaps among the pixel opening region contours, respectively.

If the line width of the first metal line 51 or the second metal line 61 is too large (for example, relative to the gap between the pixel opening region contours (PDL GAP)), it is likely to be too close to the pixel opening region, which will block or reflect the light emitted by the pixel opening region, and is also easy to be recognized by human eyes and affect the display effect of the display panel. If the line width is too small, it will easily lead to line breakage and increase the resistance of the touch electrode. By satisfying the above-mentioned relationship, the line width of the first metal line 51 or the second metal line 61 can obtain an appropriate value, thereby alleviating the above-mentioned problem.

For example, the average line width of the first metal line 51 is greater than the average line width of the second metal line 61. Setting the line width of the first metal line 51 and the line width of the second metal line 61 to be different can minimize the overlapping area between the first metal line and the second metal line, thereby reducing the capacitive load on the touch electrode and improving the touch sensitivity. In addition, because the first touch sub-electrode and the second touch sub-electrode are both composed of the first metal line 51, setting the line width of the first metal line 51 to be larger can help reduce the resistance of the touch sub-electrode, thereby further improving the touch sensitivity.

For example, t1 is 23 micrometers, t2 is 22.8 micrometers, and t3 is 23 micrometers; k1 is 27.35 micrometers, k2 is 22.86 micrometers, and k3 is 23 micrometers.

Figure 5A:
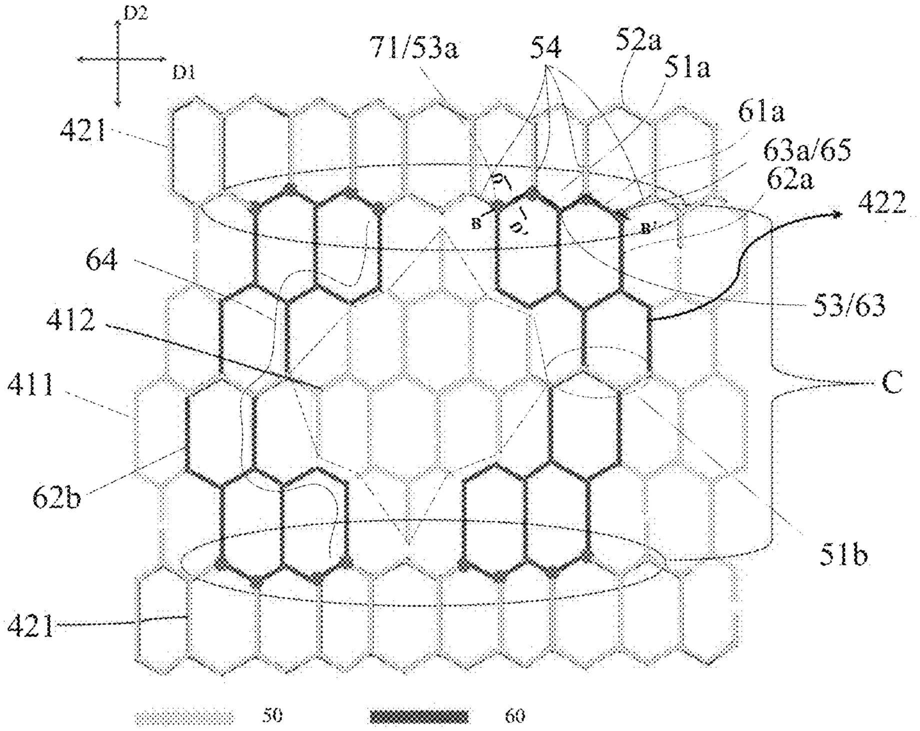
FIG. 5A is a fourth schematic diagram of a touch structure provided by at least one embodiment of the present disclosure.
Figure 5B:
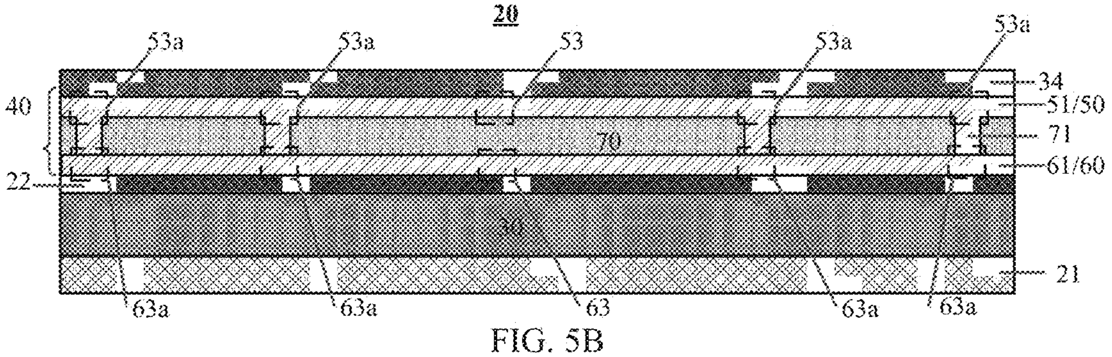
FIG. 5B is a cross-sectional view of FIG. 5A along a section line B-B'.
Figure 5C:
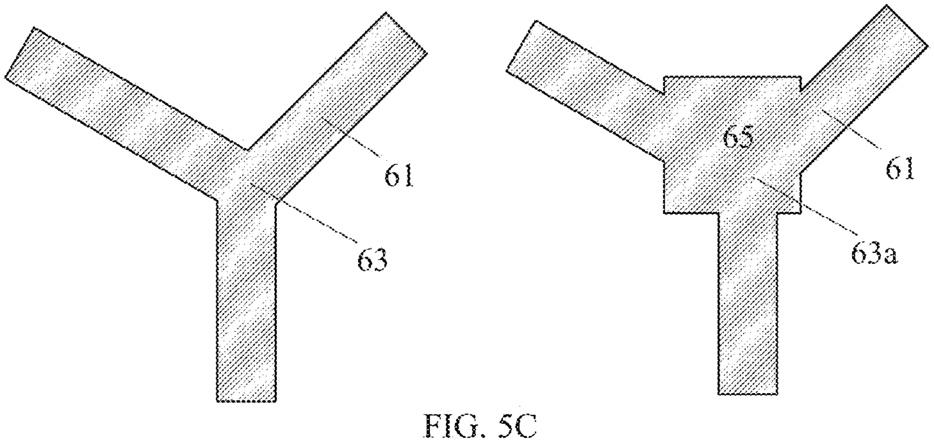
FIG. 5C is a fifth schematic diagram of a touch structure provided by at least one embodiment of the present disclosure.
Figure 5D:
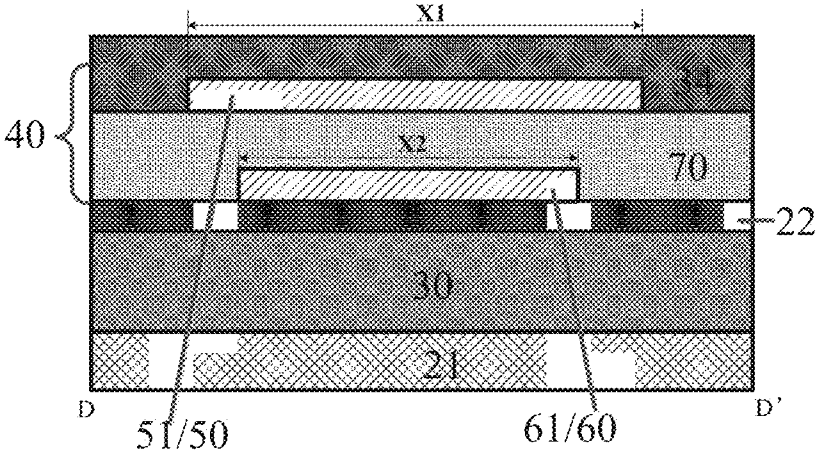
FIG. 5D is a cross-sectional view of FIG. 5A along a section line D-D'.

For example, referring to FIG. 5D, the average line width X1 of the first metal line 51 is 3.5 micrometers, and the average line width X2 of the second metal line 61 is 3.3 micrometers.

For example, as shown in FIG. 1B, the size w1 of the first metal mesh corresponding to the first pixel opening region contour 115 in the first direction D1 is 43.1 micrometers, and the maximum size yl of the first metal mesh corresponding to the first pixel opening region contour 115 in the second direction D2 (for example, the distance between two vertices, which are opposite in the second direction D2, of the first metal mesh) is 73.6 micrometers; the size w2 of the first metal mesh corresponding to the second pixel opening region contour 125 in the first direction D1 is 31.9 micrometers, the maximum size yl of the first metal mesh corresponding to the second pixel opening region contour 125 in the second direction D2 (for example, the distance between two vertices, which are opposite in the second direction D2, of the first metal mesh) is 72.9 micrometers; the size w1 of the first metal mesh corresponding to the third pixel opening region contour 135 in the first direction D1 is 42.4 micrometers, the maximum size yl of the first metal mesh corresponding to the third pixel opening region contour 135 in the second direction D2 (for example, the distance between two vertices, which are opposite in the second direction D2, of the first metal mesh) is 66.1 micrometers.

Figure 1D:
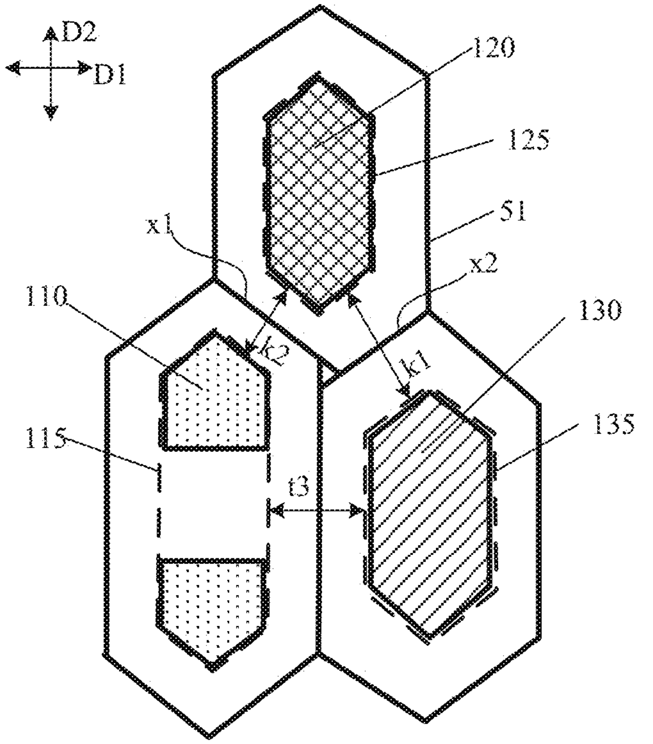
FIG. 1D is a schematic diagram of a display structure provided by another embodiment of the present disclosure.

FIG. 1D shows the first pixel opening region contour 115, the second pixel opening region contour 125, the third pixel opening region contour 135, which are adjacent, and the first metal lines 51 located therebetween. The first pixel opening region contour 115, the second pixel opening region contour 125, the third pixel opening region contour 135, which are adjacent, are arranged in a shape like a Chinese character "品"; the second pixel opening region contour 125 is adjacent to the first pixel opening region contour 115 and the third pixel opening region contour 135 in a direction that is neither parallel nor perpendicular to the second direction D2, and the first pixel opening region contour 115 and the third pixel opening region contour 135 are adjacent in the first direction D1.

As shown in FIG. 1D, for example, the gap k1 between the second pixel opening region contour 125 and the third pixel opening region contour 135 that are adjacent, the gap k2 between the second pixel opening region contour 125 and the first pixel opening region contour 115 that are adjacent, and the gap t3 between the orthographic projections of the third pixel opening region contour 135 and the first pixel opening region contour 115 that are adjacent on the base substrate 21 are different from each other. Also, because the first metal line located between the two adjacent pixel opening region contours is located in the middle of the gap between the two adjacent pixel opening region contours, this may result in that the three first metal lines 51 located between the three pixel opening region contours 115, 125, and 135 do not intersect at one point, as shown in FIG. 1D, every two of the three first metal lines 51 intersect, so as to define a triangle.

For example, as shown in FIG. 1D, the first metal mesh corresponding to the second pixel opening region contour 125 includes a first side x1 and a second side x2 that are adjacent, and the first side x1 is neither parallel nor orthogonal to the second direction D2, the second side x1 is neither parallel nor orthogonal to the second direction D2. The first side x1 is located between the second pixel opening region contour 125 and the first pixel opening region contour 115, and the second side x2 is located between the second pixel opening region contour 125 and the third pixel opening region contour 135. For example, a length of the first side x1 and a length of the second side x2 are different; for example, the first side x1 is longer than the second side x2. This asymmetry structure is also caused by the difference in the gaps among the pixel opening region contours. As shown in FIG. 1B, for example, the area of the pixel opening region 110 of the green sub-pixel 11, the area of the pixel opening region 120 of the red sub-pixel 12, and the area of the pixel opening region 130 of the blue sub-pixel 13 increase sequentially. For example, the area of the pixel opening region 110 of the green sub-pixel 11 is the smallest. This is because the lifetime of the light-emitting material of the green sub-pixel 11 is longer than the lifetime of other color sub-pixels. Therefore, setting the area of the pixel opening region 110 of the green sub-pixel 11 to a minimum value can improve light emission uniformity and stability of the display panel.

For example, as shown in FIG. 1B, the first metal mesh 52 covering the pixel opening regions of the two green sub-pixels is hexagonal, and other first metal meshes 52 directly connected to the first metal mesh 52 covering the pixel opening regions of the two green sub-pixels are also hexagonal. However, the embodiments of the present disclosure are not limited to this case. The first metal mesh can also be quadrilateral, pentagonal, or have other shapes.

As shown in FIG. 1C, the display structure 30 further includes a first encapsulation layer 33 located between the light-emitting element 23 and the touch structure 40, and the encapsulation layer 33 is configured to seal the light-emitting element 23 to prevent external moisture and oxygen from penetrating into the light-emitting element and the driving circuit to cause damage to devices, such as the light-emitting element 23. For example, the encapsulation layer 33 may have a single-layer structure or a multi-layer structure, for example, a multi-layer structure including an organic thin film, an inorganic thin film, or a multi-layer structure in which organic thin films and inorganic thin films are alternately stacked.

As shown in FIG. 1C, the touch display panel 20 further includes a buffer layer 22 located between the display structure 30 and the touch structure 40. For example, the buffer layer 22 is formed on the first encapsulation layer 33 to improve the adhesion between the touch structure 40 and the display structure 30. For example, the buffer layer 22 is an inorganic insulation layer. For example, the material of the buffer layer 22 may be silicon nitride, silicon oxide, or nireogen oxides of silicon. For example, the buffer layer 22 may also include a structure in which silicon oxide layers and silicon nitride layers are alternately stacked.

For example, the touch display panel 20 may further include a cover plate 34 located above the touch structure 40, and the cover plate 34 is, for example, a glass cover plate or an organic flexible cover plate.

In other examples, a transparent protective layer (such as transparent optical glue) may also be used instead of the cover plate 34 to protect the touch structure 40.

For example, the base substrate 21 may be a glass substrate, a silicon substrate, or a flexible substrate, for example, may be formed of a plastic material having excellent heat resistance and durability, such as polyimide (PI), polycarbonate (PC), polyethylene terephthalate (PET), polycarbonate, polyethylene, polyacrylate, polycarbonate, polyaryl compounds, polyetherimide, polyethersulfone, polyethylene terephthalate (PET), polyethylene (PE), polypropylene (PP), polysulfone (PSF), polymethyl methacrylate (PMMA), cellulose triacetate (TAC), cycloolefin polymer (COP) and cycloolefin copolymer (COC), etc.

Figure 2:
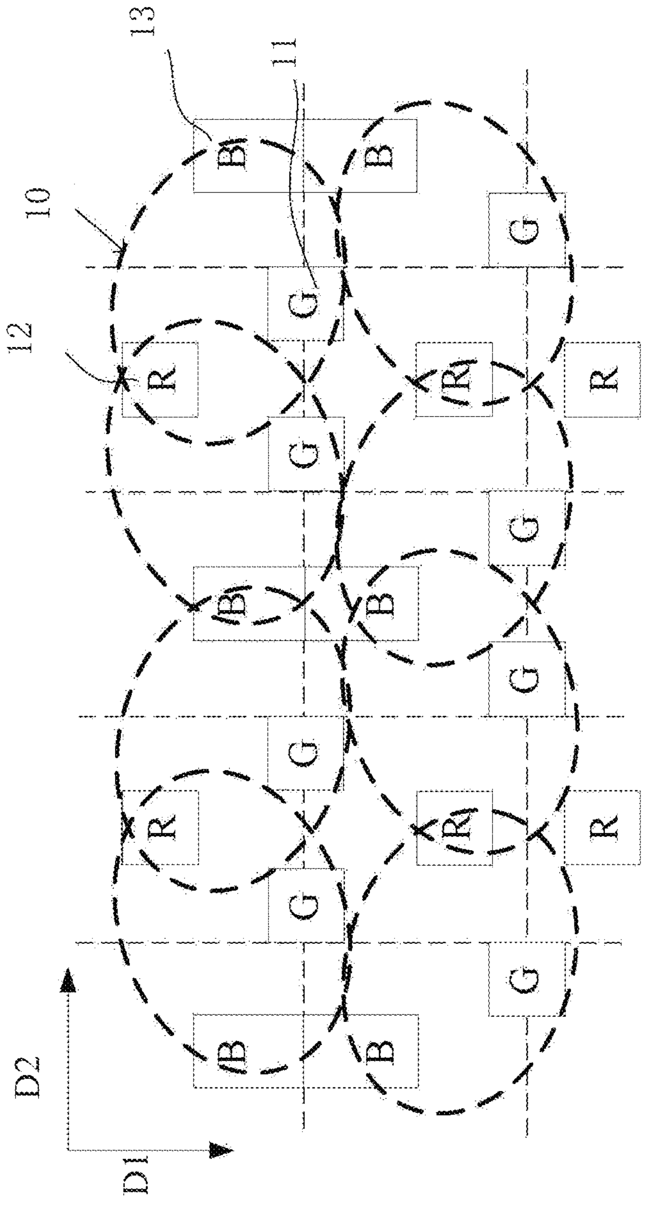
FIG. 2 is a schematic diagram of a pixel arrangement of a display structure provided by other embodiments of the present disclosure.

FIG. 2 shows another schematic diagram of a pixel arrangement provided by an embodiment of the present disclosure, unlike the pixel arrangement structure shown in FIG. 1A, in the pixel arrangement structure as shown in FIG. 2, two blue sub-pixels 13 or two red sub-pixels 12 are provided between two green sub-pixel pairs that are adjacent in the first direction. For example, the two blue sub-pixels 13 are arranged along the second direction, and the two red sub-pixels 12 are arranged along the second direction.

Similarly, the pixel opening regions of the two green sub-pixels in the green sub-image pair may be exposed to the mesh hole 520 of the same first metal mesh 52, similar portions will not be repeated here.

For example, in the case where an organic light-emitting diode is prepared by a precision metal mask (FMM) evaporation process, one evaporation hole can be used to form the light-emitting layers of the two adjacent red sub-pixels or the two adjacent blue sub-pixels, thereby reducing the difficulty of the manufacturing process.

In other examples, because the human eye has the lowest sensitivity to the position of the blue sub-pixel 13 and the brightness effect of the blue sub-pixel is also the lowest, the two blue sub-pixels 13 adjacently arranged can be merged into one sub-pixel, that is, the two blue sub-pixels 13 share the same light-emitting element and the same pixel driving circuit, thereby reducing the process difficulty and saving process cost. For example, the pixel opening regions of the two blue sub-pixels are also merged into one pixel opening region.

For example, the first metal mesh layer 50 includes a plurality of first touch sub-electrodes and a plurality of first connection electrodes arranged along the first direction D1, the plurality of first touch sub-electrodes and the plurality of first connection electrodes are alternately distributed one by one and electrically connected in sequence to form first touch electrodes extending along the first direction; the first metal mesh layer 50 further includes a plurality of second touch sub-electrodes arranged in sequence along the second direction D2 and spaced apart from each other; each of the plurality of first touch sub-electrodes and each of the plurality of second touch sub-electrodes are spaced apart from each other, and each includes a plurality of first metal meshes 52 connected to each other.

For example, the touch structure further includes a second metal mesh layer. Relative to the base substrate 21, the second metal mesh layer is located in a layer different from the first metal mesh layer, and the first metal mesh layer and the second metal mesh layer are separated by an insulation layer 70 (as shown in FIG. 1C). For example, the second metal mesh layer is closer to the base substrate.

Referring to FIG. 1C, because the second electrode 232 is a common electrode, and is used to load a constant power supply voltage; the second touch electrode 420 in the first metal mesh layer 50 needs to transmit the change amount of the touch sensing signal caused by the touch, thereby achieving the touch detection function, therefore, the first metal mesh layer are arranged to further away from the base substrate, that is, away from the second electrode 232, this arrangement can prevent the constant signal in the second electrode 232 from affecting the changed signal in the second touch electrode 420, thereby preventing from affecting the accuracy of touch detection.

The second metal mesh layer includes a plurality of second metal meshes defined by a plurality of second metal lines, orthographic projections of the plurality of second metal lines on the base substrate are located outside orthographic projections of the pixel opening regions of the plurality of sub-pixels on the base substrate, that is, are located in orthographic projections of the pixel spacing regions on the base substrate. The second metal mesh layer includes a plurality of second connection electrodes (that is, bridge electrodes) spaced apart from each other, and each of the plurality of second connection electrodes electrically connects adjacent second touch sub-electrodes to form a second touch electrode extending in the second direction. The second connection electrode includes a plurality of second metal meshes connected to each other.

Figure 3A:
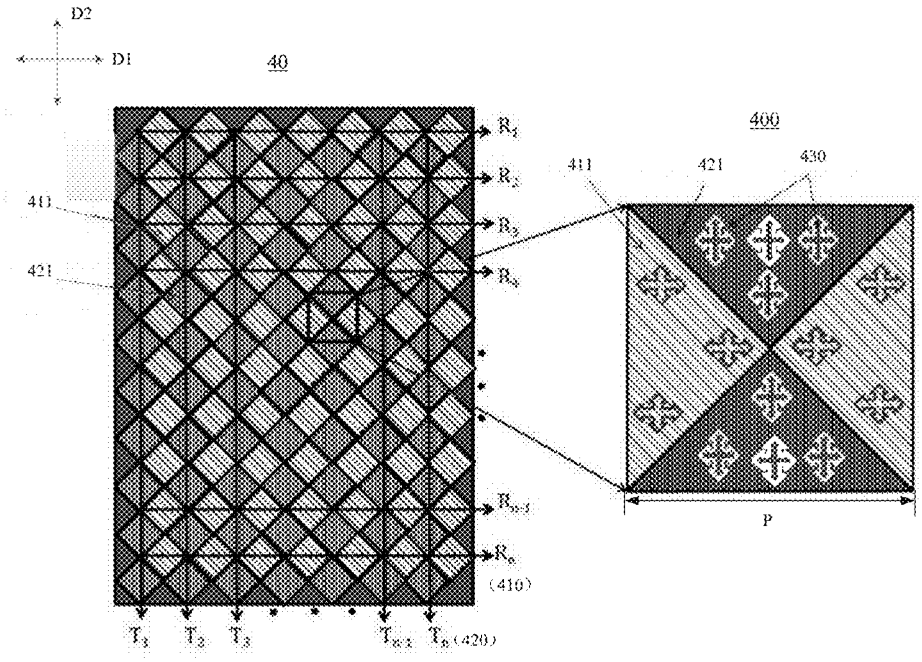
FIG. 3A is a first schematic diagram of a touch structure provided by at least one embodiment of the present disclosure.

FIG. 3A shows a schematic diagram of a touch structure 40 provided by at least one embodiment of the present disclosure. As shown in FIG. 3A, the touch electrode structure includes a plurality of first touch electrodes 410 (R1-Rn) extending in a first direction D1 and a plurality of second touch electrodes 420 (T1-Tn) extending in a second direction D2. For example, the first touch electrode 410 is a touch sensing electrode, and the second touch electrode 420 is a touch driving electrode. However, the embodiments of the present disclosure are not limited to this case, in other examples, the first touch electrode 410 may be a touch driving electrode, and the second touch electrode 420 is a touch sensing electrode.

Each first touch electrode 410 includes first touch sub-electrodes 411 sequentially arranged along the first direction D1 and connected to each other, and each second touch electrode 420 includes second touch sub-electrodes 421 sequentially arranged along the second direction D2 and connected to each other. As shown in FIG. 3, the contour of the main body of each of the first touch sub-electrode 411 and the second touch sub-electrode 421 is a rhombus. In other examples, the first touch sub-electrode 411 and the second touch sub-electrode 421 may also have other shapes, such as a triangle, a bar, and the like.

First touch sub-electrodes 411 that are adjacent in the first direction D1 are electrically connected through a first connection electrode (not shown) to form the first touch electrode 410, and second touch sub-electrodes 421 that are adjacent in the second direction D2 are electrically connected through a second connection electrode (not shown) to form the second touch electrode 420.

Each first touch electrode 410 and each second touch electrode 420 are insulated from each other and cross each other, and a plurality of touch units 400 are formed at the intersections between the first touch electrodes 410 and the second touch electrodes 420, each touch unit includes a part of each of two first touch electrode parts connected at an intersection and at least a part of each of two second touch electrode parts connected at the intersection. FIG. 3A shows an enlarged schematic diagram of a touch unit 400 on the right. As shown in FIG. 3A, each touch unit 400 includes half regions of respective two first touch sub-electrodes 411 adjacent to each other and half regions of respective two second touch sub-electrodes 421 adjacent to each other, that is, includes a region of one first touch sub-electrode and a region of one second touch sub-electrode 421 on average, the intersection of the first touch sub-electrode 411 and the second touch sub-electrode 421 in each touch unit 400 (that is, the intersection of the first connection electrode and the second connection electrode) forms a reference point for calculating coordinates. In the case where the finger touches the capacitive screen, the finger affects the coupling between the first touch electrode and the second touch electrode near the touch point, thereby changing the mutual capacitance between the two electrodes. The touch sensing signal changes according to the change amount of the capacitance of the touch screen, so that the coordinates of each touch point can be calculated based on the reference point. For example, the area of each touch unit 400 is equivalent to the contact area between a human finger and the touch panel. If the area of the touch unit is too large, it may cause a touch blind spot on the panel, and if the area of the touch unit is too small, it may cause false touch signals.

The average side length of each touch unit 400 is P, which is called a pitch of the touch structure. For example, the size of the pitch P ranges from 3.7 mm to 5 mm, for example, about 4 mm; this is because the diameter of a region where a human finger contacts the touch panel is about 4 mm. For example, the size of the pitch is the same as the average side length of each first touch sub-electrode 411 and the average side length of each second touch sub-electrode 421, and is also the same as the center distance between the adjacent first touch sub-electrodes 411 and the center distance between the adjacent second touch sub-electrodes 421.

For example, the first metal mesh layer 50 further includes dummy electrodes. As shown in FIG. 3A, each of the first touch control sub-electrode 411 and the second touch control sub-electrode 421 includes a hollow region, the dummy electrodes 430 spaced from the touch sub-electrode are provided in the hollow region of the touch sub-pixel. By providing the hollow region, the electrode area (the effective area) of the touch electrode is reduced, and the capacitive load (the self-capacitance) on the touch electrode is reduced, thereby reducing the load on the touch electrode and improving the touch sensitivity. For example, the dummy electrode 430 is in a floating state, that is, is not electrically connected to other structures or does not receive any electrical signals. For example, each of the dummy electrodes 430 includes a plurality of first metal meshes 52 connected to each other.

For example, the touch region is usually a rectangle (referring to FIG. 10), one of the touch driving electrode and the touch sensing electrode extends along a length direction of the rectangle, and the other of the touch driving electrode and the touch sensing electrode extends along a width direction of the rectangle; the touch electrode extending along the length direction is longer, so the load is larger. In order to improve the touch sensitivity of the touch electrode structure, it is necessary to reduce the load on the touch electrode.

Figure 3B:
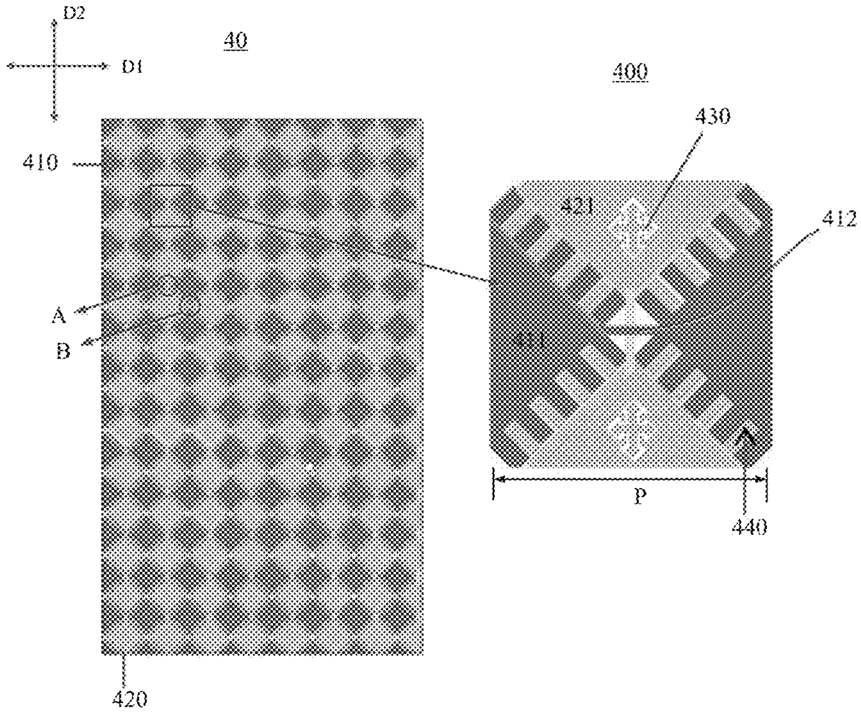
FIG. 3B is a second schematic diagram of a touch structure provided by at least one embodiment of the present disclosure.

For example, the length of the second touch electrode 420 is greater than the length of the first touch electrode 410, and the total area of the hollow region in the second touch electrode 420 is greater than the total area of the hollow region in the first touch electrode 410 (as shown in FIG. 3A), so that the self-capacitance (parasitic capacitance) on the longer second touch electrode can be effectively and targetedly reduced, and the touch sensitivity of the touch electrode structure can be improved. In addition, by arranging the dummy electrode in the same layer as the touch electrode in the hollow region, the uniformity of the film layer can be improved and the product yield can be increased. In some embodiments, the hollow region and the dummy electrode may be provided only in the longer second touch electrode, however, this design is not made for the first touch electrode (as shown in FIG. 3B).

For example, each dummy electrode 430 has the same contour as the hollow region where it is located, that is, the dummy electrode and the touch sub-electrode where the dummy electrode is located are nested with each other; there is a boundary region between the dummy electrode and the touch sub-electrode, and the dummy electrode and the touch sub-electrode are insulated from each other through the boundary region. For example, the dummy electrode 430 and the touch sub-electrode (the first touch sub-electrode or the second touch sub-electrode) that is adjacent to the dummy electrode 430 are insulated from each other by a space formed by the disconnection of the first metal line, that is, the first metal line in the boundary region forms two first metal line segments separated by a space, one of the two first metal line segments belongs to the dummy electrode 430, and the other of the two first metal line segments belongs to the touch sub-electrode.

The average size of the boundary region (the average distance between the dummy electrode and the touch electrode) is the minimum size that meets the design rule, for example, ranges from 3 micrometers to 6 micrometers. In this way, the uniformity of the film layer where the electrode is located can be improved, and the process yield can be improved. For example, sizes of the first boundary regions (gaps) between respective dummy electrodes 430 and the touch sub-electrodes nested therewith are the same.

For example, as shown in FIG. 3A, the boundary region extends along a curve, that is, the contour of the dummy electrode is a curve structure. For example, the contour includes a sawtooth structure. This design enables the region involved in the dummy electrode larger in the same area. Because the dummy electrode and the touch sub-electrode are nested with each other, the region involved in the touch electrode is also relatively large, which can avoid the blind spots caused by the reason that the dummy electrodes are too concentrated; in addition, because the touch electrode and the dummy electrode are nested with each other, that is, the inner contour of the touch electrode is also a curved structure, compared with a linear structure, this structure can increase the perimeter of the inner contour, thereby increasing the mutual capacitance of the touch electrode.

FIG. 3B shows a schematic diagram of a touch structure provided by other embodiments of the present disclosure, as shown in FIG. 3B, each of the first touch sub-electrode 411 and the second touch sub-electrode 421 includes a main body and a plurality of interdigital structures 440 extending from the main body, and the first touch sub-electrode 411 and the second touch sub-electrode 421 that is adjacent to the first touch sub-electrode 411 are nested in the first metal mesh 50 through the interdigital structures 440 to form a mutual capacitor. The interdigital structure can increase the perimeter of the touch sub-electrode under the same area, and therefore, the interdigital structure can effectively increase the mutual capacitance without increasing the self-capacitance (capacitive load) of the touch sub-electrode, thereby improving the touch sensitivity. For example, the shape of the main body may be a circle or a rectangle, and the shape of the interdigital structure includes at least one of the following shapes: a parallelogram (for example, a rectangle), a triangle, a trapezoid, and a hexagon.

For example, the plurality of interdigital structures 440 are distributed around the main body of the touch sub-electrode. For example, the main body is rectangular, and the number of the second interdigital structures 112 corresponding to each side of the main body is 3-10, such as 6-10. In other examples, the main body may also be circular, and the interdigitated structures 440 are evenly distributed on the circumference of the circular main body.

FIG. 3B shows an enlarged schematic diagram of a touch unit 400 on the right. As shown in FIG. 3B, the first touch sub-electrodes 411 that are adjacent in the first direction D1 are connected by the first connection electrode 412 to form the first touch electrode 410 extending along the first direction D1, and the second touch sub-electrodes 421 that are adjacent in the second direction D2 are connected by the second connection electrode (not shown in FIG. 3B) to form the second touch electrode 420 extending in the second direction D2.

For example, the length of each interdigital structure 440 is 1/10-1/3 of the center distance between adjacent first touch sub-electrodes 411, that is, the distance between the center points of the adjacent first touch sub-electrodes 411. For example, the center distance is the pitch P of the touch structure. For irregular interdigital structures, for example, the length may be the average length, the maximum length, or the minimum length of the interdigital structures 440.

For example, the width of each interdigital structure 440 is 1/10-1/4 of the center distance between the adjacent first touch sub-electrodes 411, for example, is 1/10-1/4 of the pitch P of the touch structure. For irregular interdigital structures, for example, the width may be the average width, the maximum width, or the minimum width of the interdigital structures 440.

For example, the gap d between adjacent interdigital structures 440 is 1/20-1/10 of the pitch P of the touch structure. In the case where the gaps between adjacent interdigital structures are not uniform, for example, the gap d may be the average gap, the maximum gap, or the minimum gap of the interdigital structures 440.

Figure 4A:
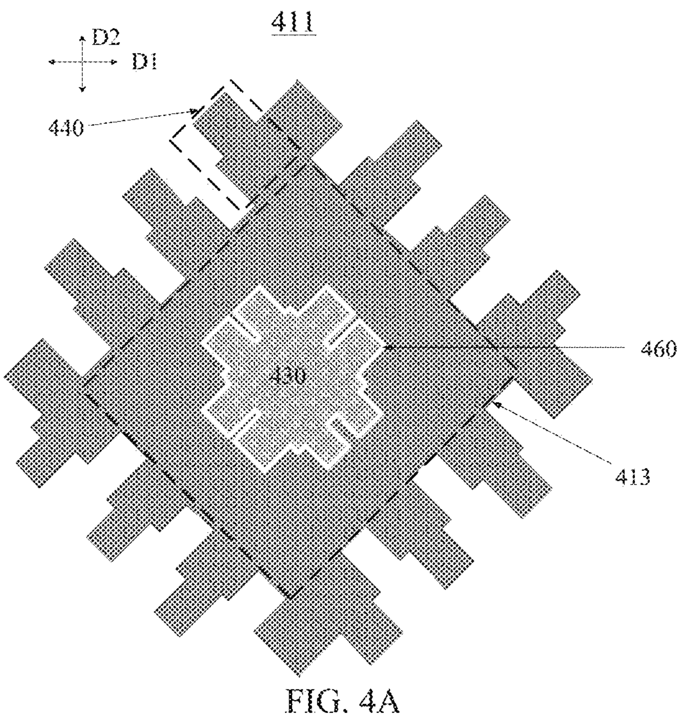
FIGS. 4A and 4B are third schematic diagrams of a touch structure provided by at least one embodiment of the present disclosure.

FIG. 4A shows an enlarged schematic diagram of a touch sub-electrode in a touch structure provided by some embodiments of the present disclosure, the touch sub-electrode may be the first touch sub-electrode 411 or the second touch sub-electrode 421. The first touch sub-electrode 411 is taken as an example for description below.

As shown in FIG. 4A, the first touch sub-electrode 411 includes a main body 413 and a plurality of interdigital structures 440 connected to the main body 413, the interdigital structures 440 are distributed around the main body 413. The main body 413 includes a plurality of sides, for example, the shape of the main body 413 is a rectangle; for example, the number of the interdigital structures 440 corresponding to each side is 3-10, such as 6-10.

For example, as shown in FIG. 4A, the dummy electrode 430 in the first touch sub-electrode 411 includes interdigital structures 460. The extension direction of the at least one interdigital structure 460 and the extension direction of the at least one interdigital structure 440 of the first touch sub-electrode 411 are parallel to each other.

For example, the interdigital structure 440 or the interdigital structure 460 may have a regular shape or an irregular shape, for example, may include at least one of the following shapes: a rectangle, a triangle, and a trapezoid. As shown in FIG. 4A, each interdigital structure 460 has a convex shape, that is, a combination of two rectangles; this structure further increases the side length of the first touch electrode portion 411 compared to the shape of a single rectangle.

Figure 4B:
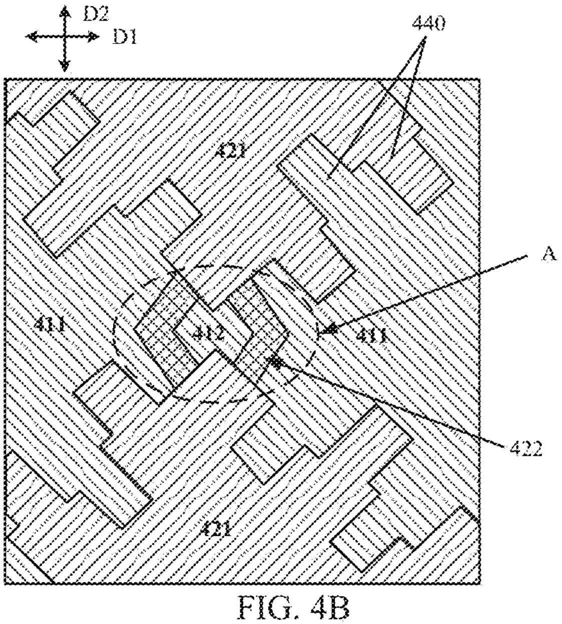

FIG. 4B shows a schematic diagram of a touch unit in a touch structure provided by some embodiments of the present disclosure. As shown in FIG. 4B, along the first direction D1, the adjacent first touch sub-electrodes 411 are electrically connected to each other through the first connection electrode 412 to form the first touch electrode 410 located in the first metal mesh layer 50; along the second direction D2, the adjacent second touch sub-electrodes 421 are electrically connected to each other through the second connection electrode 422 located in the second metal mesh layer 60 to form the second touch electrode 420. The first touch sub-electrode 411 and the second touch sub-electrode 421 are nested and isolated from each other in the first metal mesh layer 50 through the interdigital structures 440. As shown in FIG. 4B, the boundary line between the first touch sub-electrode 411 and the second touch sub-electrode 421 is zigzag due to the existence of the interdigital structures.

FIG. 5A shows an enlarged schematic diagram of a region A in FIG. 3B and FIG. 4B, the region A is the intersection of the first touch sub-electrode 411 and the second touch sub-electrode 421, that is, the bridge region; FIG. 5B is a cross-sectional view of FIG. 5A along the section line B-B', FIG. 5D is a cross-sectional view of FIG. 5A along the section line D-D', and the specific details of the display structure are omitted in FIGS. 5B and 5D.

The light mesh in FIG. 5A illustrates the first metal mesh in the first metal mesh layer 50, the first metal mesh layer 50 includes the first touch electrode 410 (including the first touch sub-electrode 411 and the first connection electrode 412) and the second touch sub-electrode 421, the first touch sub-electrode 411, the first connection electrode 412, and the second touch sub-electrode 421 each includes a plurality of first metal meshes 52 connected to each other; the dark mesh in FIG. 5A illustrates the second metal mesh in the second metal mesh layer 60, the second metal mesh layer 60 includes the second connection electrode 422, and the second connection electrode 422 includes a plurality of second metal meshes 62 connected to each other.

For example, the two ends of the second connection electrode 422 are respectively electrically connected to two second touch sub-electrodes 421 that are adjacent in the second direction D2 through the holes 71 in the insulation layer 70, so as to electrically connect the two second touch sub-electrodes 421 that are adjacent in the second direction D2. The connection region C of the two second touch sub-electrodes 421 is shown in FIG. 5A.

For example, as shown in FIG. 5A, second touch sub-electrodes 421 that are adjacent in the second direction D2 are electrically connected by two second connection electrodes 422. The arrangement of this dual-channel structure can effectively improve the yield of the device. For example, the position where the signal lines cross is likely to cause a short circuit due to electrostatic breakdown of the mutual capacitor, in the detection process, in the case where it is detected that one channel of the two second connection electrodes 422 has a short circuit failure, even if the channel is cut (for example, by laser cutting), the circuit structure can still work normally through the other channel.

For example, the orthographic projections of the plurality of first metal lines 51 in the at least two first metal meshes 52 in the second touch sub-electrode 421 on the second metal mesh layer 60 respectively overlaps the plurality of second metal lines 61 in the at least two second metal meshes 62 in each of the plurality of second connection electrodes 422, so that the at least two first metal meshes 52 have a plurality of vertices overlapping with the at least two second metal meshes 62, and the plurality of vertices include a plurality of connection vertices, the plurality of holes 71 are located at the plurality of connection vertices, respectively, that is, the plurality of holes 71 are arranged in a one-to-one correspondence manner with the plurality of connection vertices, and a vertex provided with a hole in the first metal mesh 52 is called a connection vertex.

It should be noted that the first metal line/second metal line in the present disclosure refers to the metal line connected between two adjacent vertices of the first metal mesh/second metal mesh, that is, each first metal line/second metal line corresponds to one side of the first metal mesh/second metal mesh.

For example, the at least two second metal meshes 62 are edge metal meshes located at the ends of the second connection electrode 422; the at least two first metal meshes 52 are edge metal meshes located at the ends of the second touch electrode 421. The first metal mesh 52 and the second metal mesh 62 are both polygonal.

As shown in FIG. 5A, the second connection electrode 422 is electrically connected to the first metal line 51*a* in the edge first metal mesh 52*a*, which is adjacent to the second connection electrode 422, through the second metal line 61*a* in the edge second metal mesh 62*a* located at each end, so that the second connection electrode 422 is electrically connected to the second touch sub-electrode 421.

For example, the second metal line 61*a* is located at the side, which is closest to the second touch sub-electrode 421, of the edge second metal mesh 62*a*. For example, the first metal line 51*a* is located at the side, which is closest to the second connection electrode 422, of the edge first metal mesh 52*a*. This arrangement can minimize the overlapping between the second touch sub-electrode 421 and the second connection electrode 422, thereby reducing the capacitive load on the touch sub-electrode and improving touch sensitivity.

For example, as shown in FIG. 5A and FIG. 5B, at least two second metal lines 61*a* of the polygonal edge second metal mesh 62*a*, which is located at each end, of the second connection electrode 422 and the at least two first metal lines 51*a* of the polygonal edge first metal mesh 52*a* of the adjacent second touch sub-electrode 421 overlap in a direction perpendicular to the base substrate, respectively, and are electrically connected through holes 71 in the insulation layer, so that the second connection electrode 422 is electrically connected to the second touch sub-electrode 421. For example, as shown in FIGS. 5A and 5B, the at least two first metal lines 51*a* and the at least two second metal lines 61*a* overlap each other in a direction perpendicular to the base substrate 21, so that the edge first metal mesh 52*a* has a plurality of vertices 53 overlapping with the edge second metal mesh 62*a*, the plurality of vertices 53 include a plurality of connection vertices 53*a*, and the hole 71 is respectively located at a connection vertex 53*a*, that is, the vertex 53 provided with the hole 71 is the connection vertex 53*a*. For example, the plurality of vertices 53 of the edge first metal mesh 52*a* and the plurality of vertices 63 of the edge second metal mesh 62*a* overlap each other in a direction perpendicular to the base substrate 21, and each hole 71 corresponds to a pair of vertices 53/vertices 63 overlapping each other, respectively.

It should be noted that in FIG. 5A, the first metal mesh layer 50 is closer to the viewer, so that the second metal line 61*a*, which overlaps the edge first metal mesh 52*a*, of the edge second metal mesh 62*a* is blocked by the first metal line 51*a* in the edge first metal mesh 52*a*, however, for the convenience of description, the second metal line 61*a* and the metal contact pad 65 are specifically shown in FIG. 5A.

For example, in the first metal mesh, among the vertices 53 adjacent to each connection vertex 53*a*, at most one vertex 53 (the two adjacent vertices are located at both ends of a first metal line 51) is the connection vertex 53*a*, that is, in the first metal mesh layer, there are no three consecutive vertices being connection vertices.

It should be noted that the vertex adjacent to each connection vertex refers to the vertex directly adjacent to the connection vertex through a metal line. As shown in FIG. 5A, in the case where the first metal mesh and the second metal mesh are hexagonal, the number of vertices adjacent to each connection vertex is at most three.

For example, as shown in FIGS. 5A and 5B, for each second connection electrode 422, four first metal lines 51*a* in the three polygonal edge first metal mesh 52*a* and the four second metal lines 61*a* in the two polygonal edge second metal mesh 62*a* overlap each other in a direction perpendicular to the base substrate, so that the edge first metal mesh 52*a* has five vertices 53 overlapping with the edge second metal mesh 62*a*, the four first metal lines 51*a* connect the five vertices 53 in sequence (for example, along the first direction) to form a W-shape; the five vertices 53 are sequentially denoted as No. 1 vertex, No. 2 vertex, No. 3 vertex, No. 4 vertex, and No. 5 vertex. For example, the No. 1 vertex, the No. 2 vertex, the No. 4 vertex, and the No. 5 vertex are provided with a hole 71, and are the connection vertices 53*a*, and the connection vertices 53*a* are indicated by circle dots in FIG. 5A. The four connection vertices 53*a* respectively generate four effective channels 54 for transmitting the touch signals (touch driving signals or touch sensing signals) on the second touch sub-electrode 421 to the second connection electrode 422. For example, the plurality of connection vertices 53*a* are not located on a straight line. As shown in FIG. 5A, the plurality of connection vertices 53*a* are located on two straight lines.

For example, the effective channel can be understood as the first metal line 51, which is directly connected to the connection vertex 53*a* and is necessary to transmit the touch signal in the second touch sub-electrode 421 to the second connection electrode 422 by the hole 71 corresponding to the connection vertex 53*a*. Therefore, the first metal line 51 connected between two adjacent connection vertices 53*a* is not an effective channel, because the touch signal can be transmitted to the second connection electrode 422 through the hole 71 corresponding to any connection vertex 53*a* in the case where the touch signal reaches the any connection vertex 53*a*, without passing through the first metal line 51.

Through the above setting, each connection vertex 53*a* can generate an effective channel, thereby minimizing the overlap between the first metal line 51*a* and the second metal line 52*a*.

For example, the left side of FIG. 5C shows an example of a second metal mesh 62 that is not provided with a vertex 63 with a hole, and the right side of FIG. 5C shows an example of a second metal mesh 62 that is correspondingly provided with a vertex 63*a* (corresponding to connection vertex 53*a*) with a hole 71. As shown in FIG. 5C, in order to make the first metal line 51 make good contact with the second metal line 61 through the hole 71 at the connection vertex 53*a*, the second metal mesh layer 60 will form a metal contact pad 65 having a relatively large area at the vertex 63*a*, resulting in an area occupied by the vertex 63*a* being larger than an area occupied by the original vertex 63. Similarly, the first metal mesh layer 50 will also form a metal contact pad having a relatively large area at the connection vertex 53*a*. For example, the shape of the metal contact pad is rectangular or circular, and the size (average side length or diameter) of the metal contact pad is more than twice that of the first metal line 51 or the second metal line 61. Therefore, the arrangement of the hole 71 will cause the overlap area between the first metal line 51 and the second metal line 52 to become larger.

Through the above setting, each connection vertex 53*a* can generate an effective channel, thereby minimizing the arrangement of the metal contact pad and reducing the area of the metal layer. On one hand, the self-capacitance of the second connection electrode 422 can be reduced, and on the other hand, the overlap between the first metal line 51 and the second metal line 52 can be reduced. At least from these two aspects, the capacitance load of the touch sub-electrode can be reduced and the touch sensitivity is improved.

In other examples, for example, the vertex 53 adjacent to each connection vertex 53*a* in the edge first metal mesh 52*a* is not a connection vertex. For example, for each second connection electrode 422 shown in FIG. 5A, the above-mentioned No. 1 vertex, No. 3 vertex, and No. 5 vertex can be set as the connection vertices, and the three connection vertices form three effective channels. For example, the plurality of connection vertices are located on a straight line.

For example, for each second connection electrode 422, the number of vertices at which the edge second metal mesh 62*a* and the edge first metal mesh 52*a*, which overlap with each other, is not less than 5, and the number of the connection vertices is not less than 3.

For example, the first metal line 51 directly connected to each connection vertex 53*a* is complete, that is, the first metal line 51 is connected between the two vertices of the first metal mesh 52 without a space in the middle of the first metal line 51. For example, the first metal mesh 52 where each connection vertex 53*a* is located is complete, that is, all the first metal lines 51 in the first metal mesh 52 are complete. This configuration can improve the transmission efficiency and effectiveness of the touch signal input from the second touch sub-electrode 421 to the second connection electrode 422.

For example, each second connection electrode 422 includes at least two connection lines (first connection lines), and a connection line 64 is exemplarily shown in FIG. 5A. The connection line 64 includes a plurality of second metal lines 61 that are connected end to end, each of two ends of the connection line 64 corresponds to a vertex 63*a* of a second metal mesh 62, and is electrically connected to the connection vertex 53*a* of the first metal mesh 52 through a hole 71, so as to effectively transmit signals between two adjacent second touch sub-electrodes 421. For example, the plurality of connection lines 64 do not have the second metal lines 61 overlapping (share) each other.

For example, as shown in FIG. 5A, each second connection electrode 422 further includes a plurality of middle second metal meshes 62*b*, and the plurality of middle second metal meshes 62*b* are located between the edge second metal meshes 62*a* at both ends of the second connection electrode 422, and connect the edge second metal meshes 62*a* at both ends of the second connection electrode 422. The plurality of middle second metal meshes 62*b* are sequentially connected, and each middle second metal mesh 62*a* only includes two second metal lines 61 shared with the second metal meshes 62 that are adjacent to the middle second metal mesh 62*a*, the two second metal lines 61 are not adjacent to each other, and are respectively shared by the middle second metal mesh 62*a* and the two second metal meshes 62 that are adjacent to the middle second metal mesh 62*a*. Each middle second metal mesh 62*b* includes two second metal lines 61 parallel to the second direction D2, and each of the two second metal lines 51 is located at the edge of the second connection electrode 244, that is, belongs exclusively to the middle second metal mesh 62*b* and is not shared by two second metal meshes. In this case, as shown in FIG. 5A, each second connection electrode 422 includes two connection lines 64.

For example, as shown in FIG. 5A, the orthographic projection of each first connection electrode 412 on the second metal mesh layer 60 is located in the gap between the two second connection electrodes 422, which are between the adjacent second touch sub-electrodes 421, that is, the first metal line 51 in the first connection electrode 412 and the second metal line 61 in the second metal mesh layer 60 do not overlap in a direction perpendicular to the base substrate. The range of the first connection electrode 412 is shown by a dotted line in FIG. 5A, as shown in FIG. 5A, the first connection electrode 412 is insulated from the second touch sub-electrode 421 that is adjacent to the first connection electrode 412 by a space, the space is located at the end of the first metal line 51 in the first connection electrode 412. For example, the first connection electrode 412 also forms a space at the end of the first metal line 51 to avoid overlapping with the second connection electrode 422 in a direction perpendicular to the base substrate, thereby reducing the capacitive load on the touch electrode.

For example, as shown in FIG. 5A, the second metal meshes 62 in the second connection electrode 422 are all complete meshes, and none of the second metal lines 61 in the second metal meshes 62 has a space. This is because the number of metal meshes in the second connection electrode 422 is small, which can improve the yield of the second connection electrode 422 and ensure effective transmission of the signals.

For example, as shown in FIG. 5A, none of the first metal lines 51 located at the first connection electrode 412 has a space, and the edge first metal meshes 52 located at the edge of the first connection electrode 412 are all defective, for example, are all lack at least one side, so that the second metal line 61 does not overlap the first metal line 51.

For example, as shown in FIG. 5A, each first touch sub-electrode 411 is electrically connected to a first connection electrode 412 adjacent thereto through at least one connection line 51*b* (second connection line) including a plurality of first metal lines 51 connected end to end in sequence; in a case where there are a plurality of connection lines 51*b*, the plurality of connection lines 51*b* are spaced apart from each other. The connection lines 51*b* shown in FIG. 5A include three first metal lines 51. For example, each of the first metal lines 51 in the connection line 51*b* overlaps the second metal line 61 in the second connection electrode 422 in a direction perpendicular to the base substrate, so as not to affect the pixel aperture ratio.

Figure 5E:
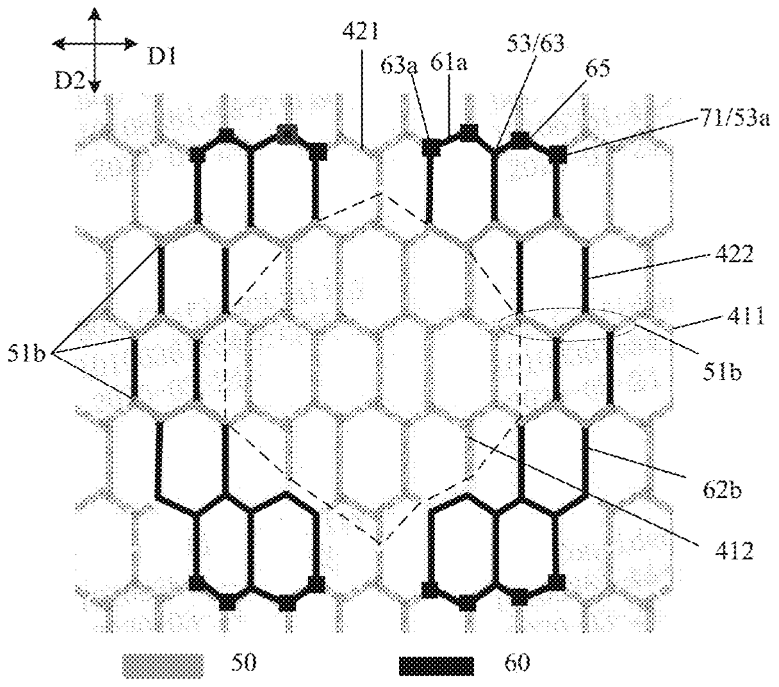
FIG. 5E is a sixth schematic diagram of a touch structure provided by at least one embodiment of the present disclosure.

FIG. 5E shows another example of an enlarged schematic diagram of a region A in FIG. 3B and FIG. 4B. The light mesh in FIG. 5E illustrates the first touch electrode 410 and the second touch sub-electrode 421 of the second touch electrode 420; the first touch electrode 410 comprises the first touch sub-pixel electrode 411 and the first connection electrode 412, the first touch control sub-electrode 411, the first connection electrode 412, and the second touch control sub-electrode 421 each includes a plurality of first metal meshes 52 connected to each other; that is, the light mesh is the first metal mesh 52 located in the first metal mesh layer 50; the dark mesh in FIG. 5E illustrates the second connection electrode 422 in the second touch electrode 420, the second connection electrode 422 includes a plurality of second metal meshes 62 connected to each other. Therefore, the dark mesh is the second metal mesh 62 located in the second metal mesh layer 60. In the figure, the range of the first connection electrode 412 is indicated by a dashed circle.

Unlike the embodiment shown in FIG. 5A, the second connection electrode 422 in the embodiment shown in FIG. 5E includes a larger number of middle second metal meshes 62*b*, and the number of connection lines 51*b* that electrically connect each first touch sub-electrode 411 and the first connection electrode 412 adjacent thereto is larger (three connection lines are shown in the figure). As shown in FIG. 5E, the plurality of connection lines 51*b* are spaced apart from each other, and the first metal lines 51 between the two adjacent connection lines 51*b* are not directly connected by a first metal line 51.

It should be noted that, in FIG. 5E, the first metal mesh layer 50 is closer to the viewer, so that the second metal line 61*a*, which overlaps the edge first metal mesh 52*a*, of the edge second metal mesh 62*a* is blocked by the first metal line 51*a* in the edge first metal mesh 52*a*; however, for the convenience of description, the second metal line 61*a* and the metal contact pad 65 are specifically shown in FIG. 5E.

For example, as shown in FIG. 5A, among the edge first metal lines of the first connection electrode 412, except for the first metal line that is electrically connected to the connection line 51*b*, the rest first metal lines all have spaces (notches) formed at the ends of the rest first metal lines away from the first connection electrode 412. As shown in FIG. 5E, the first connection electrode 412 also includes an edge first metal line with a middle space, and the space separates the first metal line 51 into two first metal line segments, and the two first metal line segments respectively belong to the first connection electrode 412 and the second touch sub-electrode 421 adjacent to the first connection electrode 412, thereby achieving that the first connection electrode 412 and the second touch sub-electrode 421 are insulated. As shown in FIGS. 5A and 5D, for example, there is no shared first metal line 51 between the first metal mesh 52 in the first touch sub-electrode 411 and the first metal mesh 52 in the first connection electrode 412, that is, the first metal mesh 52 in the first touch sub-electrode 411 and the first metal mesh 52 in the first connection electrode 412 do not form an electrical connection by sharing the first metal line 51.

This arrangement can minimize the overlap between the metal line in the first touch sub-electrode 411 and the metal line in the second connection electrode 422, thereby reducing the mutual capacitance between the first touch sub-electrode 411 and the second connection electrode 422. In the case where the mutual capacitance value between the first touch electrode 410 and the second touch electrode 420 changes due to the touch signal, because the reference mutual capacitance value is small, the change amount of the mutual capacitance value is easier to be detected, thereby improving the sensitivity of the touch detection.

Figure 6A:
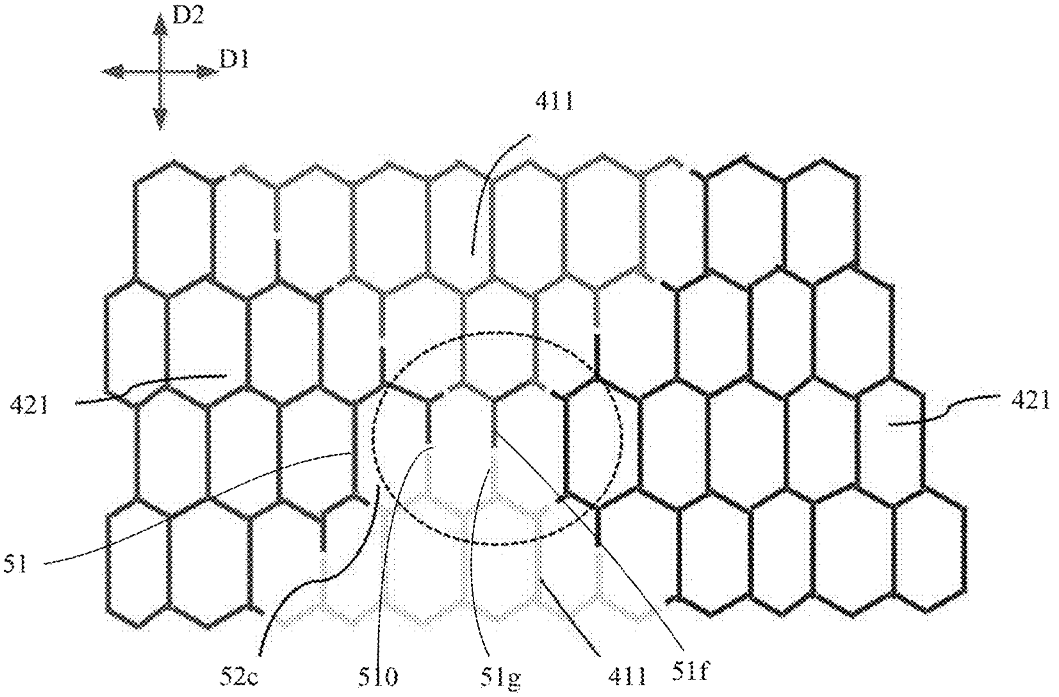
FIG. 6A is a seventh schematic diagram of a touch structure provided by at least one embodiment of the present disclosure.
Figure 6B:
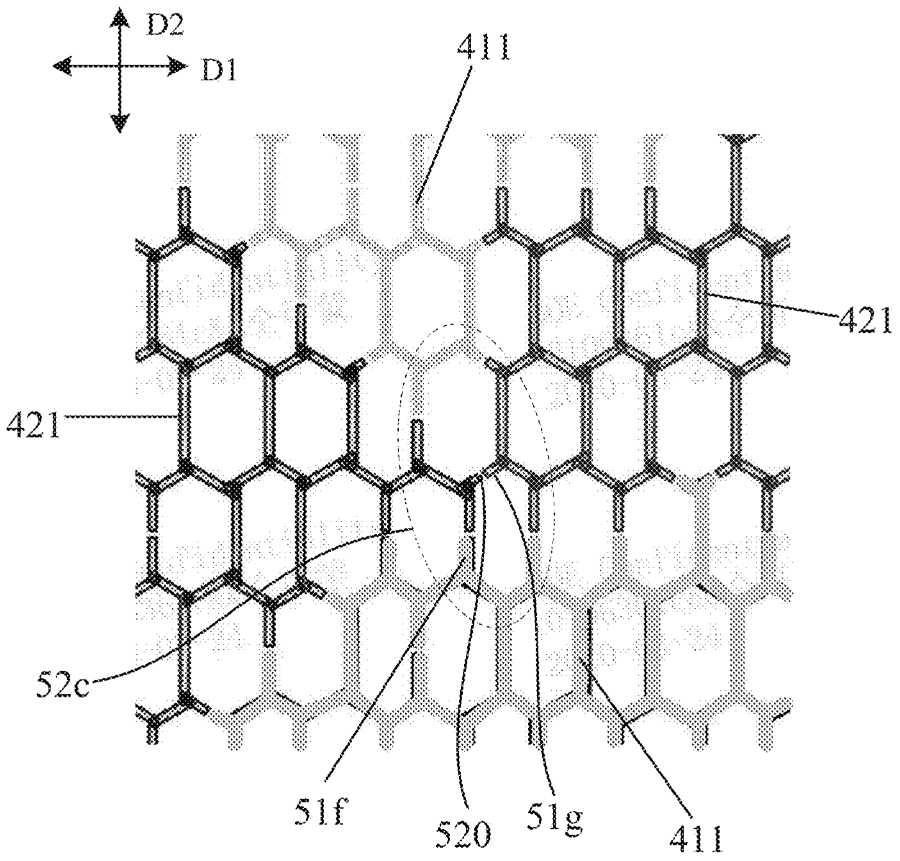
FIG. 6B is an eighth schematic diagram of a touch structure provided by at least one embodiment of the present disclosure.

FIGS. 6A and 6B respectively show two examples of the enlarged schematic diagram of the region B in FIG. 3B, the region B involves two first touch sub-electrodes 411 that are adjacent and insulated in the second direction D2 and two second touch sub-electrodes 421 that are adjacent and insulated in the first direction D1. The region B is an isolation region of the four touch sub-electrodes.

For example, as shown in FIG. 5D, the average line width X1 of the first metal line 51 is greater than the average line width X2 of the second metal line 61. For example, in the width direction of the metal line, the orthographic projection of the second metal line 61 on the base substrate 21 is located within the orthographic projection of the first metal line 51 on the base substrate 21, which can effectively increase the aperture ratio of the display substrate.

The metal meshes shown in FIG. 6A are all located in the first metal mesh layer, that is, are all first metal meshes, the light mesh represents the first metal mesh in the adjacent first touch sub-electrodes 411, and the dark mesh represents the first metal mesh in the two adjacent second touch sub-electrodes 421.

As shown in FIG. 6A, the first touch sub-electrode 411 and the second touch sub-electrode 421 are adjacent to each other, and each of the plurality of first metal lines 51 located in the boundary region between the first touch sub-electrode 411 and the second touch sub-electrode 421 includes a plurality of spaces (fracture) 510, each space 510 is located, for example, in the middle of the first metal line 51 where the space 510 is located, and separates the first metal line 51 where the space 510 is located into two first metal line segments 51*f*, and one of the two first metal line segments 51*f* belongs to the first touch sub-electrode 411, and the other of the two first metal line segments 51*f* belongs to the second touch sub-electrode 421, so that the first touch sub-electrode 411 and the second touch sub-electrode 421 that are adjacent are insulated.

It should be noted that the first metal line segment belonging to the touch sub-electrode in the embodiment of the present disclosure means that there is an electrical connection relationship between the first metal line segment and the touch sub-electrode.

In the touch structure provided by at least one embodiment of the present disclosure, the touch sub-electrodes that are adjacent and insulated (for example, the first touch sub-electrode and the second touch sub-electrode that are adjacent, two second touch sub-electrodes that are adjacent to each other in the first direction, and two first touch sub-electrodes that are adjacent to each other in the second direction) are insulated by a space formed by the disconnection of the metal line; compared with insulating by arranging dummy electrodes, this arrangement can maximize the arrangement area of the touch electrodes, increase the density of the touch electrodes, and thus improve the touch sensitivity.

For example, as shown in FIG. 6A, the edge metal meshes of each touch sub-electrode are incomplete, that is, all include a part of the first metal mesh, and the edge metal meshes in adjacent touch sub-electrodes match each other to define the first metal mesh.

For example, the at least one first metal mesh includes three first metal mesh parts insulated from each other, and the three first metal mesh parts belong to one first touch sub-electrode and two second touch sub-electrodes adjacent to each other in the first direction D1. For example, the shape of the first metal mesh is a hexagonal shape, and the at least two first metal meshes include the above-mentioned three first metal mesh parts that are insulated from each other.

As shown in FIGS. 6A and 6B, in FIGS. 6A and 6B, each of the two first metal meshes 52*c* in the dashed circle includes three first metal mesh parts that are insulated from each other, the three first metal mesh parts belong to three touch sub-electrodes that are insulated from each other, and the three touch sub-electrodes include two first touch sub-electrodes 411 adjacent to each other in the second direction D2 and one second touch sub-electrode 421 located between the two first touch sub-electrodes (as shown in FIG. 6A), or the three touch sub-electrodes include two second touch sub-electrodes 421 adjacent to each other in the first direction D1 and one first touch sub-electrode 411 located between the two second touch sub-electrodes 421 (as shown in FIG. 6B). This design enables the touch sub-electrodes effectively insulated while being more compactly arranged, thereby improving the touch sensitivity.

For example, as shown in FIGS. 6A and 6B, there is a space 510 on each of the three sides of each metal mesh 52*c*, so that the metal mesh is divided into three parts.

For example, as shown in FIGS. 6A and 6B, a shape of the first metal mesh 52*c* is a polygon, such as a hexagon. The hexagon includes two sides parallel to the second direction D2 and opposite to each other. The first metal line 51 of the first metal mesh 52*c* located on at least one side has a space, which divides the first metal line into two first metal line segments 51*f*. For example, as shown in FIG. 6A, the two first metal line segments 51*f* respectively belong to two first touch sub-electrodes 411 adjacent in the second direction. For example, as shown in FIG. 6B, the two first metal line segments 51*f* belong to the first touch sub-electrodes 411 and that second touch sub-electrodes 421 that are adjacent, respectively.

For example, as shown in FIGS. 6A and 6B, the polygons of the two first metal meshes 52*c* share one side, that is, the two first metal meshes 52*c* share a first metal line 51*g*, there is a space 520 on the first metal line 51*g*, and the space 520 separates the first metal line 51*g* into two first metal line segments that are spaced apart to each other.

For example, as shown in FIG. 6A, the two first metal meshes 52*c* are arranged along the first direction D1, and the shared first metal line 51*g* is parallel to the second direction D2. The two first metal line segments in the shared first metal line 51*g* respectively belong to the two first touch sub-electrodes 411 adjacent in the second direction D2; that is, the two first touch sub-electrodes 411 adjacent in the second direction D2 are directly adjacent to each other through the space or spaced apart from each other through the space. For example, the two second touch sub-electrodes 421 adjacent in the first direction D1 are separated from each other by a part of the two first touch sub-electrodes 411 adjacent in the second direction D2.

For example, as shown in FIG. 6B, the arrangement direction of the two first metal meshes 52*c* is neither parallel nor perpendicular to the second direction D2, and the shared first metal line 51*g* is neither parallel nor perpendicular to the second direction D2. The two first metal line segments in the shared first metal line 51*g* respectively belong to two second touch sub-electrodes 421 adjacent in the first direction D1; that is, the two second touch sub-electrodes 421 adjacent in the first direction D1 are directly adjacent to each other through the space or spaced apart from each other through the space. For example, the two first touch sub-electrodes 411 adjacent in the second direction D2 are separated from each other by a part of the two second touch sub-electrodes 421 adjacent in the first direction D1.

For example, as shown in FIGS. 6A and 6B, each of the three first metal mesh parts of one first metal mesh 52*c* of the two first metal meshes 52*c* includes a complete first metal line 51; the numbers of the first metal lines included in the three first metal mesh parts of the other first metal mesh 52*c* are different from each other, for example, the numbers are 0, 1, and 2, respectively.

As shown in FIGS. 6A and 6B, each first metal mesh part includes two first metal line segments 51*f*, or only includes two first metal line segments 51*f*; or each first metal mesh part includes a complete first metal line 51 and two first metal line segments 51*f*, and the first metal line 51 is connected between the two first metal line segments; or each first metal mesh part includes two complete first metal lines 51 and two first metal line segments 51*f*, and the two first metal lines 51 are connected between the two first metal line segments 51*f*.

The inventor found that in the boundary between the first touch control sub-electrode and the second touch control sub-electrode, because the first touch control sub-electrode and the second touch control sub-electrode are insulated by a disconnection line, there are spaces of metal lines with a higher density per unit area. In the case where these spaces have a certain regular continuity, as a result, there is a significant difference in the reflection of ambient light between the space and the metal line, thereby resulting in that a severely visible gap shadow is formed on the finally formed product, which greatly affects the user experience. For example, in the case where the touch structure is applied to a display device, the shadow will reduce the display quality.

At least one embodiment of the present disclosure further provides a touch structure, a plurality of spaces on a first metal line in a boundary region between a first touch sub-electrode and a second touch sub-electrode of the touch structure include a plurality of first spaces on a first line, the plurality of first spaces are respectively located on a plurality of first metal lines intersecting the first line, and the first line extends substantially in a certain direction; there is at least one first metal line between at least two first spaces, the at least one first metal line intersects the first line, and there is no space at the intersection between the at least one first metal line and the first line.

Through this setting, the continuity of the spaces in the boundary region can be effectively broken, and the purpose of shadow elimination can be achieved.

It should be noted that the first line may be a straight line or a curve extending substantially in a certain direction, for example, a polygonal line. Due to process fluctuations, the plurality of first spaces are not necessarily located strictly on a straight line, but fluctuate up and down relative to the straight line. As long as the curve extends substantially along a certain fixed direction, this embodiment also falls within the protection scope of the present disclosure.

In some examples, the first line is a first straight line. For example, the plurality of first spaces are respectively located on a plurality of first metal lines orthogonal to the first straight line.

The following takes the case that the first line is the first straight line as an example to exemplarily illustrate the touch structure provided by at least one embodiment of the present disclosure, but this is not a limitation of the present disclosure.

Figure 7A:
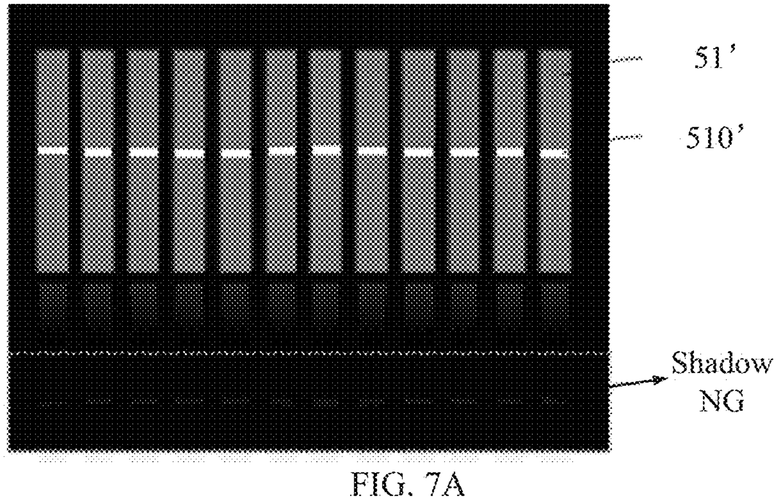
FIG. 7A is a schematic diagram of a metal line space design.

FIG. 7A is a shadow schematic diagram of a metal line space design. As shown in the figure, the plurality of spaces 510' on the plurality of metal lines 51' are continuously located on a straight line without discontinuity. For example, there is no metal line among the plurality of spaces 510', and there is no space at the intersection between the metal line and the straight line. The arrangement of the metal lines produces a visually obvious shadow (shadow NG).

Figure 7B:
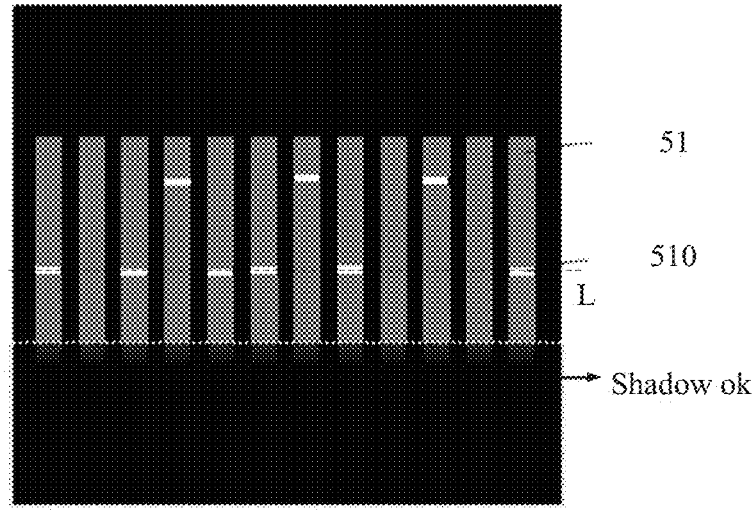
FIG. 7B is a simulation diagram of a shadow elimination design of a touch structure provided by an embodiment of the present disclosure.

FIG. 7B is a simulation diagram of a shadow elimination design of a touch structure provided by at least one embodiment of the present disclosure. As shown in the figure, a plurality of spaces 510 on a plurality of parallel metal lines are located on a straight line L orthogonal to the metal lines, there is no space at the intersection between the metal line 51 between at least two spaces 510 located on the straight line L and the straight line, and therefore, the shadow problem has been significantly ameliorated (shadow OK).

Figure 8:
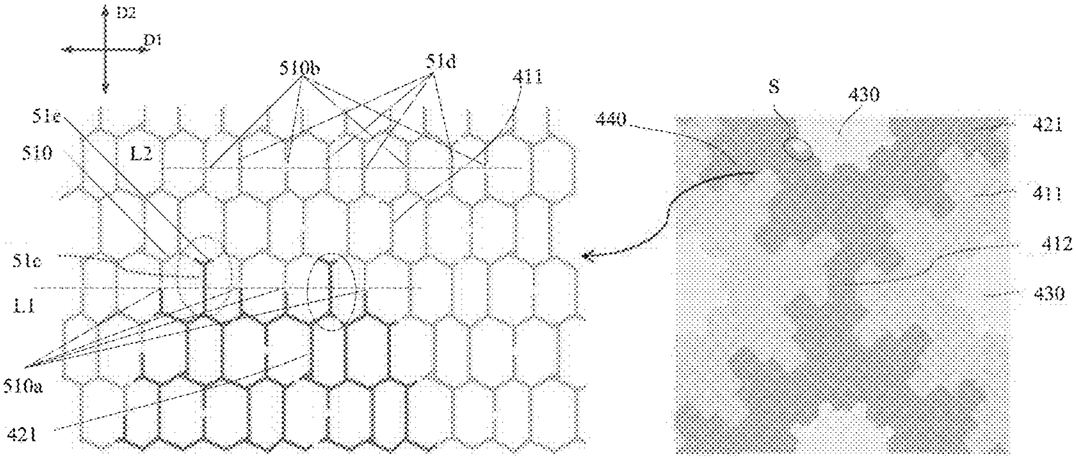
FIG. 8 is a ninth schematic diagram of a touch structure provided by at least one embodiment of the present disclosure.

FIG. 8 shows a schematic diagram of a touch structure provided by at least one embodiment of the present disclosure. The right side of FIG. 8 shows a schematic diagram of a touch unit in the touch structure, and the left side of FIG. 8 shows an enlarged schematic diagram of a boundary region between the first touch sub-electrode 411 and the second touch sub-electrode 421 of the touch structure; for example, the light mesh indicates the first metal mesh in the first touch sub-electrode 411, and the dark mesh indicates the first metal mesh in the second touch sub-electrode 421.

As shown in FIG. 8, in the boundary region between the first touch sub-electrode 411 and the second touch sub-electrode 421, there are a plurality of first spaces 510*a* located on the first straight line L1, the plurality of first spaces are respectively located on a plurality of first metal lines 51 orthogonal to the first straight line L1, and the plurality of first metal lines 51 are parallel to each other, for example, are parallel to the second direction D2. There is at least one first metal line 51*c* (two first metal lines circled in FIG. 8) between the at least two first spaces 510*a*, and the first metal line 51*c* intersects the first straight line L1 and there is no space at the intersection between the first metal line 51*c* and the first straight line L1.

Through the setting of the first metal line 51*c*, the continuity of the plurality of spaces 510*a* located on the first straight line L1 is broken, and the effect of shadow elimination is effectively achieved.

It should be noted that the above plurality of first spaces all refer to the spaces between two touch sub-electrodes (such as the first touch sub-electrode and the second touch sub-electrode that are adjacent, two second touch sub-electrodes that are adjacent in the first direction, two first touch sub-electrodes that are adjacent in the second direction), so as to break the regularity of the arrangement of the local spaces.

For example, the first straight line L1 is parallel to the first direction D1, that is, the extension direction of the first straight line L1 is the same as the extension direction of the first touch electrode 410; for example, the first metal line 51*c* is parallel to the first metal line 51 with a first space; for example, the first metal line 51*c* is parallel to the second direction D1. For example, there is no space on the first metal line 51*c*.

For example, the first metal line 51*e* directly connected to one end of the first metal line 51*c* has a space, so that the first touch sub-electrode 411 is insulated with the second touch sub-electrode 421; at least one of the first metal lines directly connected to the other end of the first metal line 51*c* does not have a space, so that the first metal line 51*c* is electrically connected to the main body of the touch sub-electrode (as shown in FIG. 8, the second touch sub-electrode 421) to which the first metal line 51*c* belongs.

For example, a shape of the first metal mesh 51 is a polygon that includes more than four sides, such as a pentagon or a hexagon. This arrangement can diversify the extension directions of the sides of the metal mesh, so that the arrangement of the spaces on the metal line is not prone to regular continuity. However, this case is not a limitation to the embodiments of the present disclosure.

As shown in FIG. 8, a shape of the first metal mesh is a hexagon; the extension direction of the first metal line 51*e* is inclined to the extension direction of the first metal line 51*c*; for example, the extension direction of the first metal line 51*e* is neither parallel nor perpendicular to the first direction D1.

Figure 9:
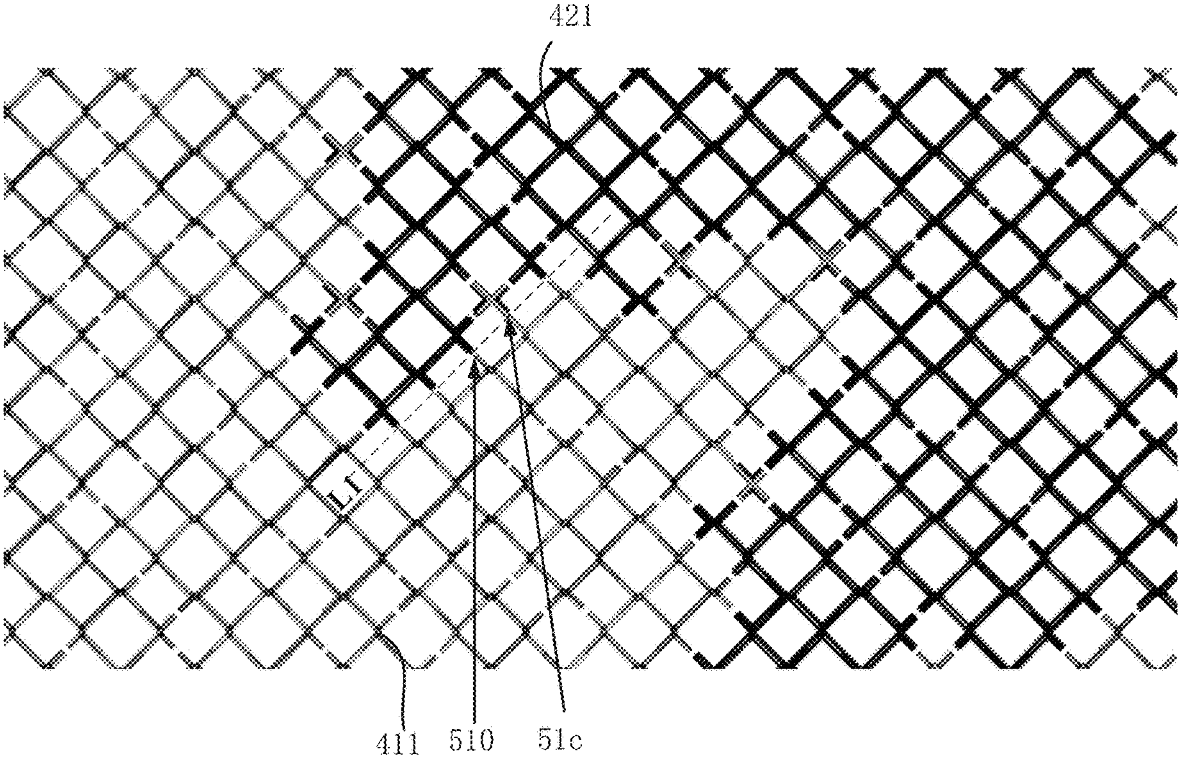
FIG. 9 is a tenth schematic diagram of a touch structure provided by at least one embodiment of the present disclosure.

FIG. 9 show a schematic diagram of a touch structure provided by another embodiment of the present disclosure, this figure shows a boundary region between the first touch sub-electrode 411 and the second touch sub-electrode 421 of the touch structure; for example, the light mesh indicates the first metal mesh in the first touch sub-electrode 411, and the dark mesh indicates the first metal mesh in the second touch sub-electrode 421. The figure shows the first straight line L1. The difference between the embodiment shown in FIG. 9 and the embodiment shown in FIG. 8 is that the first metal mesh in this embodiment is quadrilateral, such as rectangular. For specific details, reference may be made to the description of the embodiment shown in FIG. 8, which will not be repeated here.

For example, there is also a space in the first metal line 51 inside the first touch sub-electrode 411 or the second touch sub-electrode 421, thereby reducing the difference in light reflection between the first metal line inside the touch sub-electrode and the first metal line on the boundary region, and improving the user experience. For example, a space located inside the touch sub-electrode separates the first metal line into two first metal line segments, and the two first metal line segments all belong to the same touch sub-electrode.

For example, the density of the spaces inside the touch sub-electrode is equivalent to the density of the spaces at the boundary region, thereby improving the display uniformity and the process uniformity.

For example, the design rule of the spaces inside the touch sub-electrode is similar to the design rule of the spaces at the boundary region.

For example, the space 510 is located in the middle of the first metal line 51 where the space 510 is located.

The spaces inside the first touch sub-electrode and the spaces inside the touch sub-electrode of the touch structure provided by the embodiments of the present disclosure will be exemplarily described below with reference to FIG. 8.

For example, as shown in FIG. 8, the spaces of the first metal lines located inside the first touch sub-electrode 411 includes a plurality of second spaces 510*b* located on the second straight line L2, and the plurality of second spaces 510*b* are respectively located on the plurality of first metal lines 51 orthogonal to the second straight line L2; there is at least one first metal line 51*d* between at least two second spaces 510*b*, the first metal line 51*d* intersects the second straight line L2, and the first metal line 51*d* does not have a space at the intersection between the first metal line 51*d* and the second straight line.

For example, the second straight line L2 is parallel to the first direction D1.

This arrangement can effectively break the continuity of the spaces inside the touch sub-electrode, thereby achieving the shadow elimination design.

For example, as shown in FIG. 8, inside the first touch sub-electrode 411, each first metal mesh has at most two first metal lines that have spaces, thereby ensuring effective electrical connection.

For example, the boundary region between the dummy electrode 430 in the touch sub-electrode (the first touch sub-electrode or the second touch sub-electrode) and the touch sub-electrode can also be provided with a similar space design. For example, the plurality of first metal lines located in the boundary region between the touch sub-electrode and the dummy electrode respectively includes a plurality of spaces, and each space of the plurality of spaces separates the first metal line where the space is located into two first metal line segments, one of the two first metal line segments belongs to the touch sub-electrode, and the other of the two first metal line segments belongs to the dummy electrode, so that the touch sub-electrode and the dummy electrode are insulated. The plurality of spaces includes a plurality of third spaces located on a third straight line, and the plurality of third spaces are respectively located on a plurality of first metal lines intersecting the third straight line; there is at least one first metal line between at least two third spaces, each of the at least one first metal line intersects the third straight line, and each first metal line of the at least one first metal line does not have a space at the intersection between the first metal line and the third straight line. For example, the enlarged schematic diagram on the left side of FIG. 8 can be regarded as corresponding to the boundary region (for example, the region S shown in FIG. 8) between the touch sub-electrode and the dummy electrode for similar understanding, the dark mesh and the light mesh in the enlarged schematic diagram are respectively understood as the first metal mesh in the touch sub-electrode and the first metal mesh in the dummy electrode, and the first straight line L1 in the figure is understood as the third straight line.

This arrangement can effectively break the continuity of the spaces in the boundary region between the touch sub-electrode and the dummy electrode inside the touch sub-electrode, thereby achieving the shadow elimination design.

The embodiment of the present disclosure also provides a touch panel including the above-mentioned touch structure.

Figure 10:
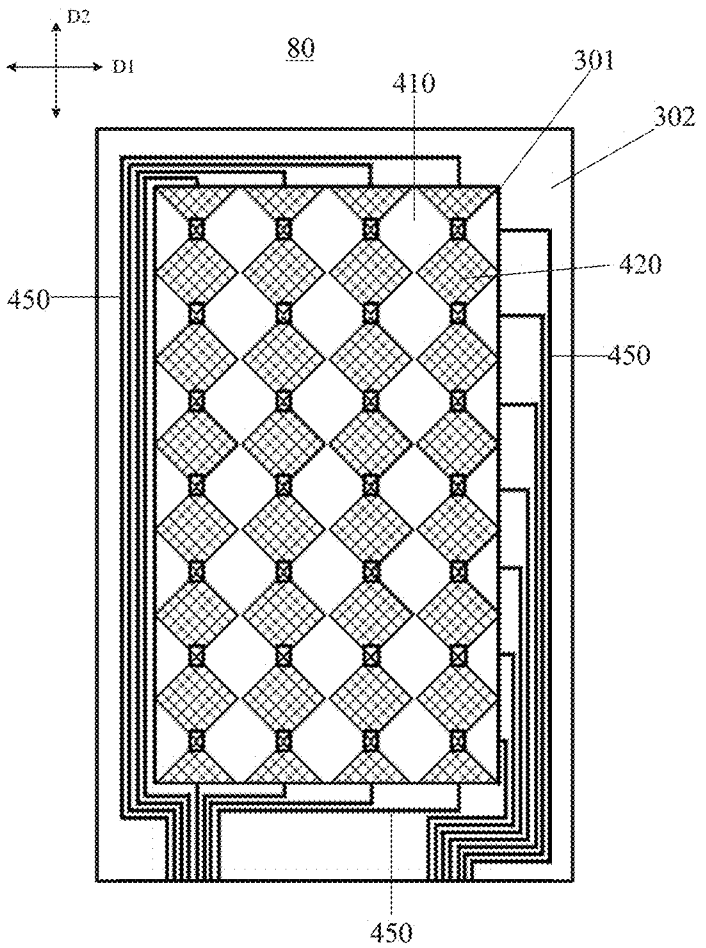
FIG. 10 is a schematic diagram of a touch structure provided by at least one embodiment of the present disclosure.

FIG. 10 is a schematic diagram of a touch panel provided by at least one embodiment of the present disclosure. As shown in FIG. 10, the touch panel 80 includes a touch region 301 and a non-touch region 302 located outside the touch region 301, and the touch structure 40 is located in the touch region 301. For example, the first touch electrode 410 extends along the width direction of the rectangle, and the second touch electrode 420 extends along the length direction of the rectangle. For clarity, the figure does not show the structures of the first touch electrode and the second touch electrode in detail.

For example, as shown in FIG. 10, the touch panel 80 further includes a plurality of signal lines 450 located in the non-touch region 302. Each of each first touch electrode 410 and each second touch electrode 420 is electrically connected to a signal line 450, and is connected to a touch controller or a touch integrated circuit (not shown in the figure) through the signal line. For example, the first touch electrode 410 is a touch driving electrode, and the second touch electrode 420 is a touch sensing electrode, however the embodiments of the present disclosure are not limited to this case.

The touch integrated circuit is, for example, a touch chip for providing touch driving signals to the second touch electrode 420 in the touch panel 80, receiving touch sensing signals from the first touch electrode 410, and processing the touch sensing signals, such as providing the processed data/signal to the system controller to achieve the touch sensing function.

For example, as shown in FIG. 10, the ends of the plurality of signal lines 450 connected to the touch integrated circuit may all be arranged on the same side of the touch region 301 (for example, the lower side in FIG. 10), which can facilitate the connection between the touch integrated circuit and the plurality of signal lines 450.

For example, as shown in FIG. 10, because the second touch electrode 420 is longer than the first touch electrode 410 and has a larger load, in order to increase the signal transmission speed, a signal line 450 may be respectively provided at both ends of a first touch electrode 410, during operation, the touch integrated circuit simultaneously inputs touch driving signals (that is, bilateral driving) to a second touch electrode 420 through two signal lines 450, so that the loading speed of the signal on the second touch electrode 420 is increased, thereby improving the detection speed.

For example, the material of the first metal mesh layer 50 or the second metal mesh layer 60 includes metal materials, such as aluminum, molybdenum, copper, silver, or alloy materials of these metal materials, such as silver-palladium-copper alloy (APC) material.

For example, the width of each space (the dimension along the length direction of the metal line) is 5.2 microns.

For example, the material of the insulation layer 70 may be an inorganic insulation material, for example, the inorganic insulation material is a transparent material. For example, the inorganic insulation material is an oxide of silicon such as silicon oxide, silicon nitride, and silicon oxynitride, a nitride of silicon, or an oxynitride of silicon, or an insulation material including metal oxynitride, such as aluminum oxide and titanium nitride.

For example, the material of the insulation layer 70 may also be an organic insulation material to obtain good bending resistance. For example, the organic insulation material is a transparent material. For example, the organic insulation material is OCA optical glue. For example, the organic insulation material may include polyimide (PI), acrylate, epoxy resin, polymethyl methacrylate (PMMA), and the like.

An embodiment of the present disclosure also provides an electronic device, and the electronic device includes the above-mentioned touch structure 40, the above-mentioned touch display panel 20, or the above-mentioned touch panel 80. For example, the electronic device is a touch display device integrated with a touch function, and the touch display device may be any product or component with a display function and a touch function, such as: a display, an OLED panel, an OLED TV, an electronic paper, a mobile phone, a tablet computer, a notebook computer, a digital photo frame, a navigator, etc.

Figure 11:
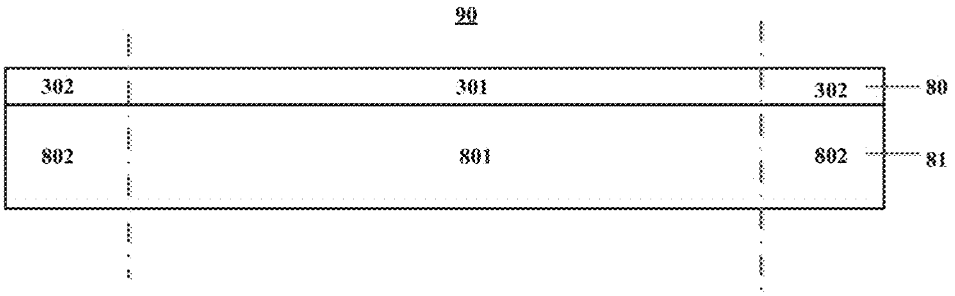
FIG. 11 is a schematic diagram of an electronic device provided by at least one embodiment of the present disclosure.

FIG. 11 shows a schematic diagram of an electronic device provided by an embodiment of the present disclosure. For example, the electronic device 90 is a touch display device, and the touch display device includes a touch panel 80 and a display panel 81, and the display panel 81 and the touch panel 80 are stacked. The display panel 81 includes a display region 802 and a non-display region 801. For example, the display region 301 and the touch region 801 are aligned with each other so as to correspond to each other, and the non-display region 802 and the non-touch region 302 are aligned with each other so as to correspond to each other. The display panel 81 and the touch panel 80 are fixed to each other by, for example, glue, or are formed integrally, that is, the touch panel 80 is directly formed on the display panel 81 using the display panel 81 as a substrate.

What have been described above merely are exemplary embodiments of the present disclosure, and not intended to define the scope of the present disclosure, and the scope of the present disclosure is determined by the appended claims.

What is claimed is:

1. A touch display panel, comprising: a base substrate, and a display structure and a touch structure that are stacked on the base substrate, wherein the display structure comprises a plurality of sub-pixels, the plurality of sub-pixels are arranged along a first direction and a second direction, and each of the plurality of sub-pixels comprises a light-emitting element and a pixel opening region exposing the light-emitting element;

the first direction and the second direction intersect;

the touch structure comprises a first metal mesh layer, the first metal mesh layer comprises a plurality of first metal meshes defined by a plurality of first metal lines, and orthographic projections of the plurality of first metal lines on the base substrate are located outside orthographic projections of a plurality of pixel opening regions of the plurality of sub-pixels on the base substrate;

an orthographic projection of a mesh hole of each of at least one first metal mesh on the base substrate covers orthographic projections of only two pixel opening regions of two adjacent sub-pixels on the base substrate, and the two adjacent sub-pixels are two first sub-pixels and are configured to emit light of a first primary color;

an interval distance between adjacent first sub-pixels is smaller than an interval distance between two sub-pixels emitting light of a same one other color, and is smaller than an interval distance between each of the first sub-pixels and any other one sub-pixel emitting light of other primary color; and each of orthographic projections of mesh holes of other first metal meshes, which are directly connected to the at least one first metal mesh, on the base substrate, covers only an orthographic projection of a pixel opening region of one sub-pixel on the base substrate.

2. The touch display panel according to claim 1, wherein a center distance between the two pixel opening regions of the two first sub-pixels is smaller than a center distance between two pixel opening regions of two sub-pixels emitting light of same one other primary color, which is different to the first primary color.

3. The touch display panel according to claim 1, wherein areas of the two pixel opening regions of the two first sub-pixels are equal and smaller than an area of a pixel opening region of a sub-pixel that emits light of other primary color.

4. The touch display panel according to claim 1, wherein the plurality of sub-pixels are in a plurality of pixel units, and each of the plurality of pixel units is configured to emit light of full-color; and the two first sub-pixels belong to two pixel units, respectively.

5. The touch display panel according to claim 3, wherein each sub-pixel emitting light with a color different from the first primary color is configured to be shared by at least two pixel units, respectively.

6. The touch display panel according to claim 1, wherein the first primary color is green.

7. The touch display panel according to claim 1, wherein the plurality of first metal meshes are arranged along the first direction and the second direction; and each of the plurality of first metal meshes is polygon, and extension directions of longest sides of respective first metal meshes are parallel to each other and are all along the second direction.

8. The touch display panel according to claim 7, wherein a pixel opening region contour of a pixel opening region corresponding to each first metal mesh is polygon, and a plurality of edges of each first metal mesh are respectively parallel to a plurality of edges of the pixel opening region contour corresponding to each first metal mesh;

two sides, which are close to each other, of two adjacent pixel opening region contours are parallel to each other, and a first metal line is between the two sides; and orthographic projections of the two sides, which are close to each other, of the two adjacent pixel opening region contours on the base substrate are both parallel to an orthographic projection of the first metal line on the base substrate, and a distance between one of the orthographic projections of the two sides and the orthographic projection of the first metal line on the base substrate and a distance between other of the orthographic projections of the two sides and the orthographic projection of the first metal line on the base substrate are identical.

9. The touch display panel according to claim 8, wherein an average line width of the first metal line and a distance between the two adjacent pixel opening region contours satisfies a following relationship:

$$(\text{PDLGAPmax} - \text{PDLGAPmin}) * 0.5 < X < \text{PDLGAPmax} * 0.167,$$

where X is the average line width of the first metal line, and PDLGAPmax and PDLGAPmin are a maximum value and a minimum value of the distance between the two adjacent pixel opening region contours, respectively.

10. The touch display panel according to claim 8, wherein the plurality of sub-pixels further comprise a second sub-pixel and a third sub-pixel, the second sub-pixel is configured to emit light of a second primary color, and the third sub-pixel is configured to emit light of a third primary color, an area of a pixel opening region of the first sub-pixel, an area of a pixel opening region of the second sub-pixel, and an area of a pixel opening region of the third sub-pixel sequentially increase.

11. The touch display panel according to claim 10, wherein a contour of pixel opening regions of the two first sub-pixels, which are adjacent, is a first pixel opening region contour, a pixel opening region contour of the second sub-pixel is a second pixel opening region contour, and a pixel opening region contour of the third sub-pixel is a third pixel opening region contour;

a first metal mesh corresponding to the second pixel opening region contour comprises a first side and a second side, which are adjacent, the first side is neither parallel nor orthogonal to the second direction, and the second side is neither parallel nor orthogonal to the second direction;

the first side is between the second pixel opening region contour and the first pixel opening region contour, and the second side is located between the second pixel opening region contour and the third pixel opening region contour; and the first side is longer than the second side.

12. The touch display panel according to claim 1, wherein the first metal mesh layer comprises a plurality of first touch sub-electrodes and a plurality of first connection electrodes arranged along the first direction, the plurality of first touch sub-electrodes and the plurality of first connection electrodes are alternately distributed one by one and electrically connected in sequence to form a first touch electrode extending along the first direction;

the first metal mesh layer further comprises a plurality of second touch sub-electrodes arranged sequentially along the second direction and spaced apart from each other; and each of the plurality of first touch sub-electrodes and each of the second touch sub-electrodes are spaced apart from each other, and each of the plurality of first touch sub-electrodes and each of the second touch sub-electrodes comprise a plurality of first metal meshes, respectively;

wherein the touch structure further comprises a second metal mesh layer, and the first metal mesh layer and the second metal mesh layer are separated by an insulation layer between the first metal mesh layer and the second metal mesh layer;

the second metal mesh layer comprises a plurality of second metal meshes defined by a plurality of second metal lines, and orthographic projections of the plurality of second metal lines on the base substrate are located outside the orthographic projections of the plurality of pixel opening regions of the plurality of sub-pixels on the base substrate;

the second metal mesh layer comprises a plurality of second connection electrodes spaced apart from each other, and each of the plurality of second connection electrodes is electrically connected to adjacent second touch sub-electrodes through a plurality of holes in the insulation layer, thereby electrically connecting the adjacent second touch sub-electrodes to form a second touch electrode extending in the second direction;

wherein a plurality of second metal lines of at least two second metal meshes in each of the plurality of second connection electrodes respectively overlap with a plurality of first metal lines of at least two first metal meshes in an adjacent second touch sub-electrode in a direction perpendicular to the base substrate, so that the at least two first metal meshes have a plurality of vertices overlapping with the at least two second metal meshes, each of the plurality of holes is at a vertex, and the vertex is called a connection vertex.

13. The touch display panel according to claim 12, wherein at most one vertex among vertices adjacent to each connection vertex is a connection vertex.

14. The touch display panel according to claim 12, wherein vertices adjacent to each connection vertex are not connection vertices.

15. The touch display panel according to claim 12, wherein the at least two second metal meshes are edge metal meshes of the second connection electrode, and the at least two first metal meshes are edge metal meshes of the second touch electrode.

16. The touch display panel according to claim 12, wherein adjacent second touch sub-electrodes are electrically connected through two second connection electrodes, and the two second connection electrodes are spaced apart from each other and are symmetrical with respect to a central axis extending in the second direction;

wherein an orthographic projection of each of the plurality of first connection electrodes on the second metal mesh layer is in a gap between the two second connection electrodes between adjacent second touch sub-electrodes; and each of the plurality of first touch sub-electrodes is electrically connected to an adjacent first connection electrode through at least one connection line comprising a plurality of first metal lines that are sequentially connected end to end;

wherein the plurality of first metal lines that are sequentially connected end to end respectively overlap with a plurality of second metal lines in the second connection electrode in a direction perpendicular to the base substrate.

17. The touch display panel according to claim 12, wherein an average line width of the first metal line is greater than an average line width of the second metal line.

18. The touch display panel according to claim 12, wherein a plurality of first metal lines in a boundary region between a first touch sub-electrode and a second touch sub-electrode, which are adjacent, respectively comprise a plurality of spaces, each space of the plurality of spaces divides a first metal line, where the each space is located, into two first metal line segments, one of the two first metal line segments belongs to the first touch sub-electrode, the other one of the two first metal line segments belongs to the second touch sub-electrode, so that the first touch sub-electrode and the second touch sub-electrode, which are adjacent, are insulated;

wherein the plurality of spaces comprises a plurality of first spaces on a straight line, and the plurality of first spaces are respectively on a plurality of first metal lines orthogonal to the straight line; and at least one first metal line is between at least two first spaces, and the at least one first metal line intersects the straight line, and there is no space at an intersection of the at least one first metal line and the straight line.

19. The touch display panel according to claim 12, wherein the first metal mesh layer comprises a plurality of first touch electrodes along the second direction;

at least one first metal mesh comprises three first metal mesh parts insulated from each other, and the three first metal mesh parts respectively belong to three touch sub-electrodes that are insulated from each other, the three touch sub-electrodes comprise two first touch sub-electrodes that are adjacent in the second direction and a second touch sub-electrode between the two first touch sub-electrodes, or comprise two second touch sub-electrodes that are adjacent in the first direction and a first touch sub-electrode between the two second touch sub-electrodes.

20. An electronic device, comprising the touch display panel according to claim 1.

* * * * *